(12) United States Patent
Lee et al.

(10) Patent No.: US 7,876,618 B2
(45) Date of Patent: Jan. 25, 2011

(54) NON-VOLATILE MEMORY WITH REDUCED LEAKAGE CURRENT FOR UNSELECTED BLOCKS AND METHOD FOR OPERATING SAME

(75) Inventors: Sanghyun Lee, Davis, CA (US); Masaaki Higashitani, Cupertino, CA (US); Shinji Sato, Milpitas, CA (US); Chih-Ming Wang, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 119 days.

(21) Appl. No.: 12/409,020

(22) Filed: Mar. 23, 2009

(65) Prior Publication Data

US 2010/0238729 A1 Sep. 23, 2010

(51) Int. Cl.
*G11C 16/04* (2006.01)
(52) U.S. Cl. .................... 365/185.11; 365/185.18; 365/185.23
(58) Field of Classification Search ............ 365/185.11, 365/185.17, 185.18, 185.23, 185.24
See application file for complete search history.

(56) References Cited

U.S. PATENT DOCUMENTS

| | | | |
|---|---|---|---|
| 5,912,837 A | 6/1999 | Lakhani | |
| 5,978,266 A | 11/1999 | Chen et al. | |
| 6,301,155 B1 | 10/2001 | Fujiwara | |
| 6,560,152 B1 | 5/2003 | Cernea | |
| 6,798,694 B2 | 9/2004 | Mihnea et al. | |
| 6,801,454 B2 | 10/2004 | Wang | |
| 6,845,045 B1 | 1/2005 | Cernea | |
| 7,313,027 B2 * | 12/2007 | Hosono | 365/185.23 |
| 7,336,541 B2 | 2/2008 | Aritome | |
| 7,414,895 B2 * | 8/2008 | Aritome | 365/185.25 |
| 7,453,733 B2 | 11/2008 | Hosono | |
| 7,573,752 B2 * | 8/2009 | Aritome | 365/185.25 |
| 7,733,702 B2 * | 6/2010 | Hosono | 365/185.2 |
| 2008/0137422 A1 | 6/2008 | Hosono | |

* cited by examiner

*Primary Examiner*—Gene N Auduong
(74) *Attorney, Agent, or Firm*—Vierra Magen Marcus & DeNiro LLP

(57) ABSTRACT

A memory device with reduced leakage current during programming and sense operations, and a method for operating such a memory device. In a non-volatile memory device, current leakage at the drain select gates of NAND strings can occur in unselected blocks when a selected block undergoes a program or read operation, and the bit lines are shared by the blocks. In one approach, in which a common transfer gate driver is provided for both blocks, the drain select gates are pre-charged at an optimum level, which minimizes leakage, and subsequently floated while a program or read voltage is applied to a selected word line in the selected block. In another approach, a separate transfer gate driver is provided for the unselected block so that the optimal select gate voltage can be driven in the unselected block, even while the program or read voltage is applied in the selected block.

20 Claims, 18 Drawing Sheets

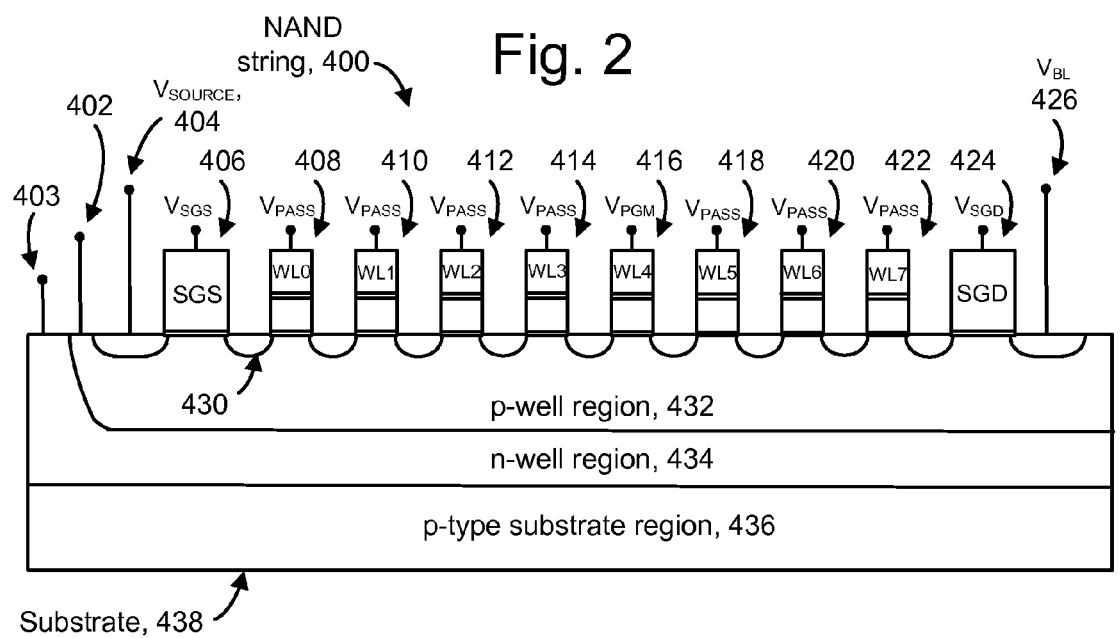

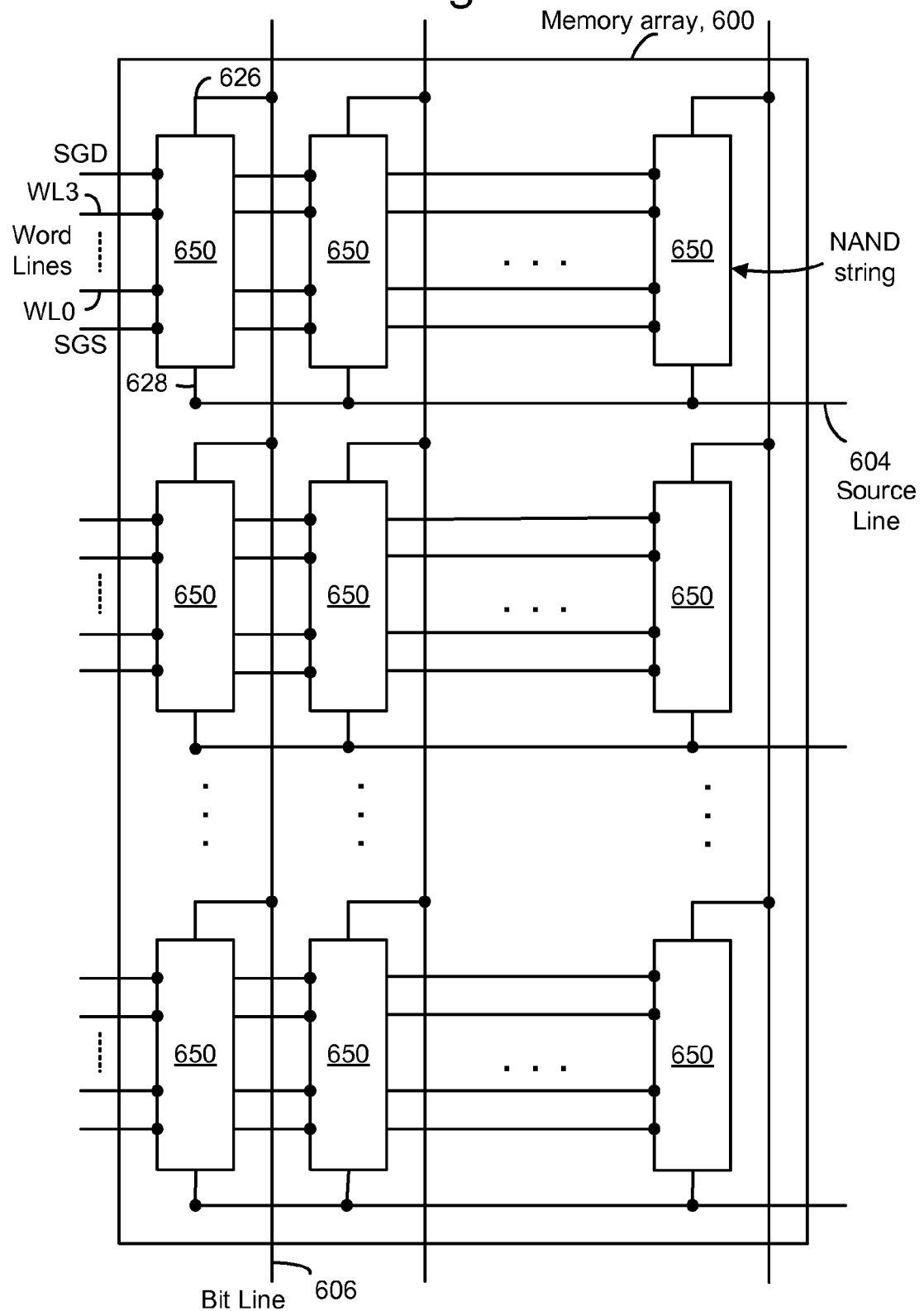

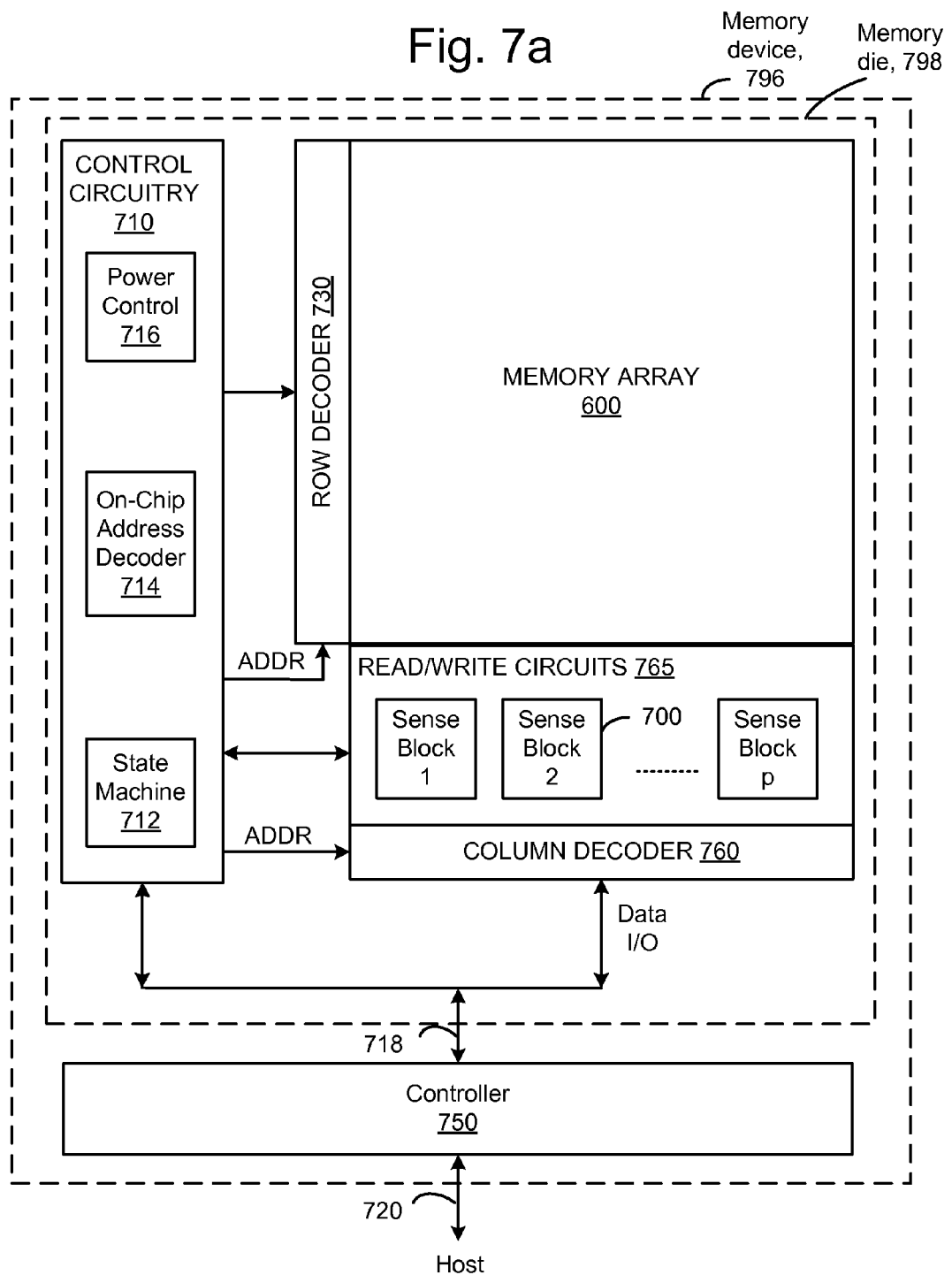

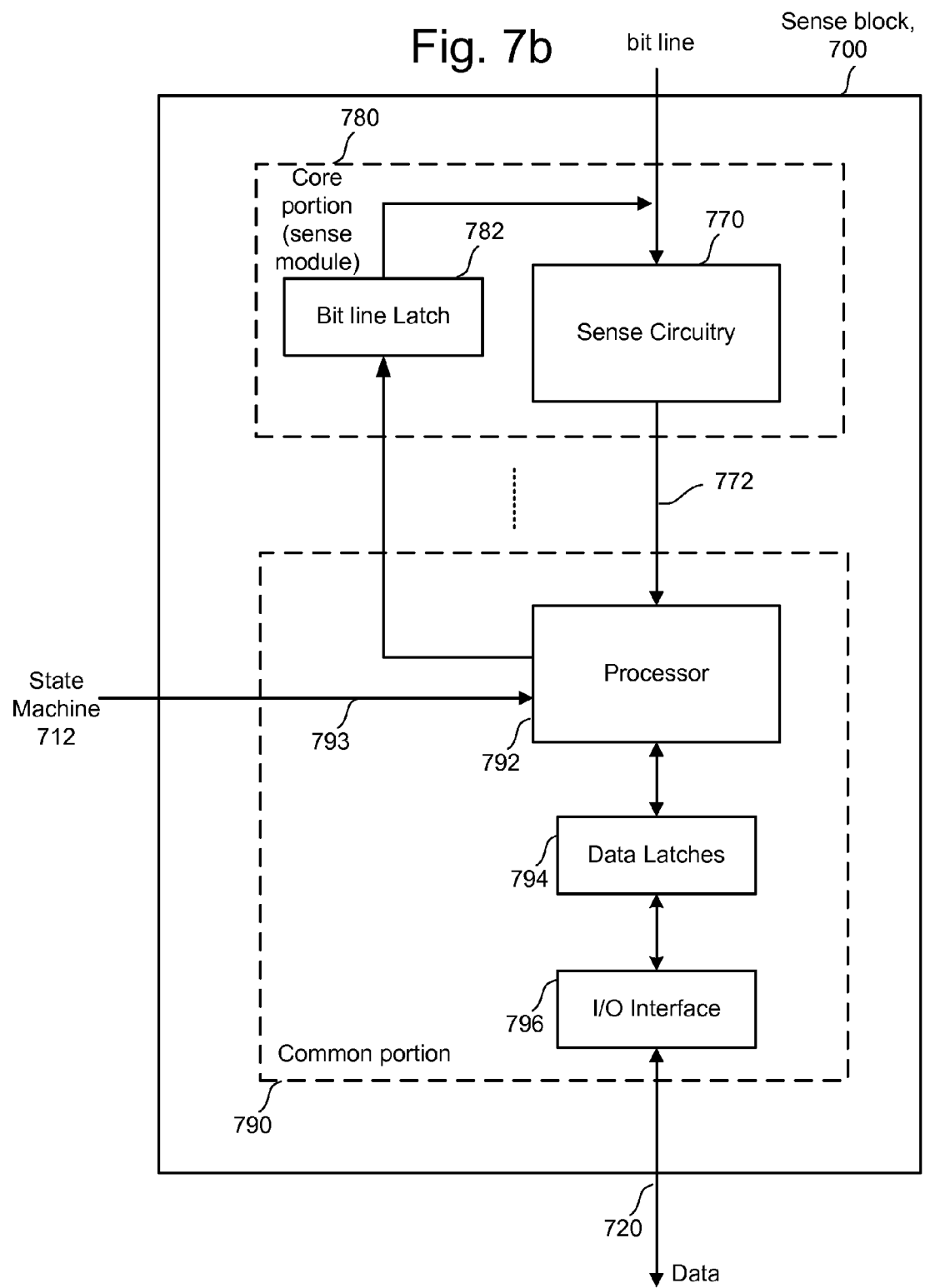

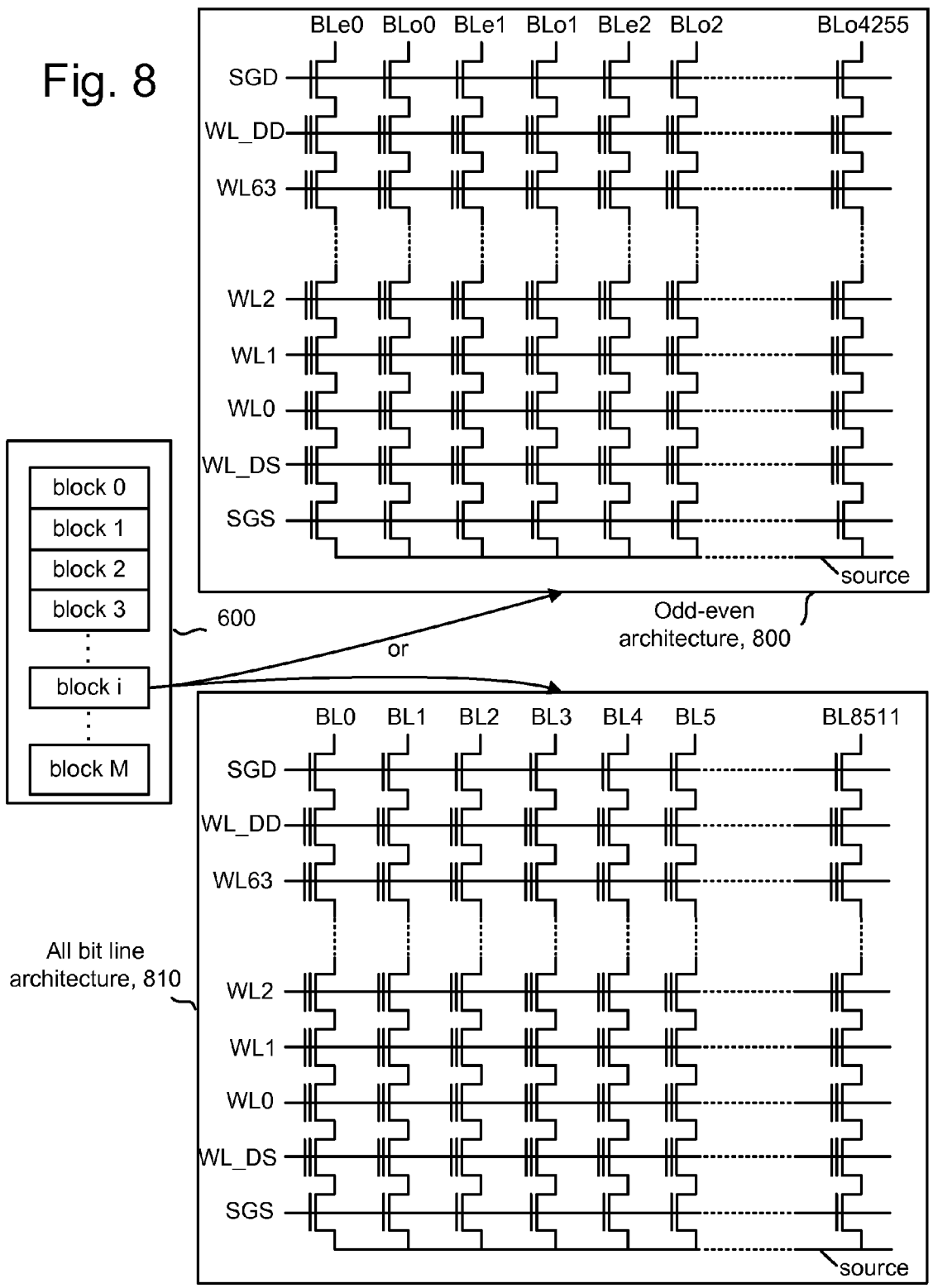

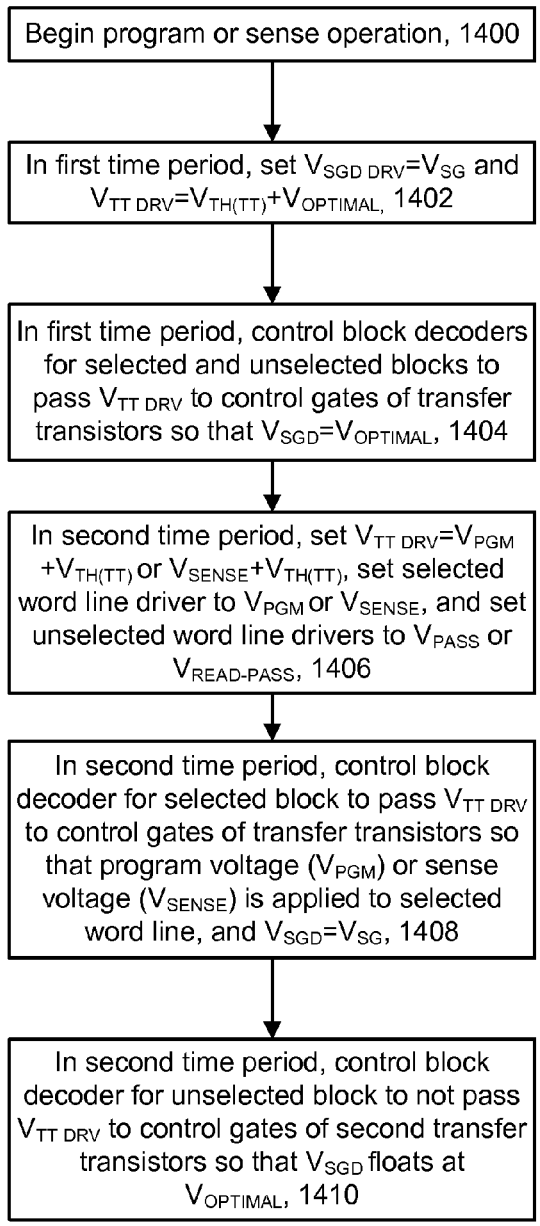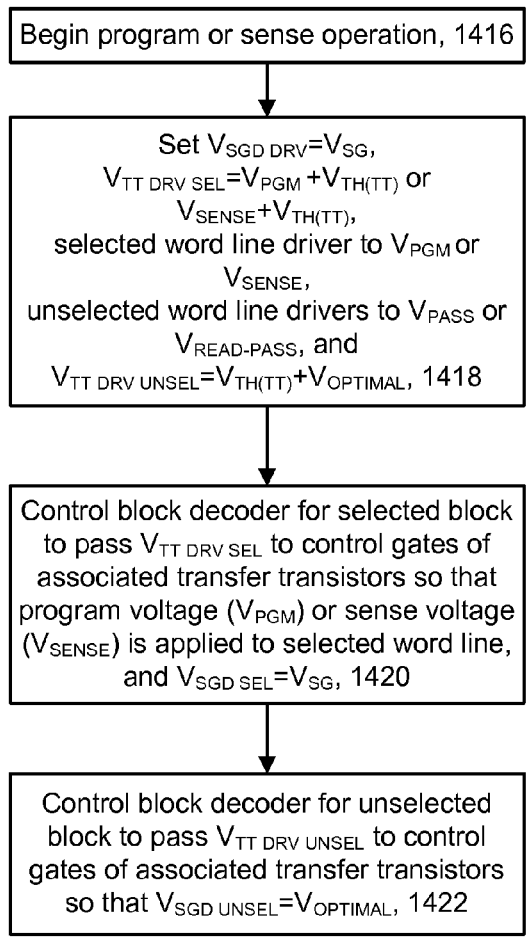

US 7,876,618 B2

NON-VOLATILE MEMORY WITH REDUCED LEAKAGE CURRENT FOR UNSELECTED BLOCKS AND METHOD FOR OPERATING SAME

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

However, due to market place demands, there is a continuing need to reduce power consumption and improve performance in memory devices.

SUMMARY OF THE INVENTION

The present invention provides a memory device with reduced leakage current during programming and sense operations, and a method for operating such a memory device.

In one embodiment, a method for operating non-volatile storage includes performing an operation involving a selected block of a memory device. The memory device includes at least one unselected block, where the selected block and the at least one unselected block each comprise strings of series-connected non-volatile storage elements, a drain select gate is at one end of each string, and bit lines which are common to the selected block and the at least one unselected block are in communication with active regions of the drain select gates of the selected block and the at least one unselected block. The performing of the operation includes, during a first time period, biasing the drain select gates of the selected block at a first non-zero level via a first transfer transistor which is associated with the selected block, and biasing the drain select gates of the at least one unselected block at the first non-zero level via a second transfer transistor which is associated with the at least one unselected block. The performing further includes, during a second time period which follows the first time period, concurrently: (a) biasing the drain select gates of the selected block via the first transfer transistor at a second non-zero level, which is higher than the first non-zero level, and (b) floating a voltage of the drain select gates of the at least one unselected block.

In another embodiment, a method for operating non-volatile storage includes performing an operation involving a selected block of a memory device. The memory device includes at least one unselected block, where the selected block and the at least one unselected block each comprise strings of series-connected non-volatile storage elements, a drain select gate is at one end of each string, and bit lines which are common to the selected block and the at least one unselected block are in communication with active regions of the drain select gates of the selected block and the at least one unselected block. The performing includes concurrently: (a) applying a particular non-zero voltage to a selected word line of the selected block, and (b) biasing the drain select gates of the selected block at a first non-zero level via a first transfer transistor, and biasing the drain select gates of the at least one unselected block at a different, second non-zero level via a second transfer transistor.

In another embodiment, a non-volatile storage system includes at least first and second blocks of non-volatile storage elements, where each block comprises strings of series-connected non-volatile storage element, and each string extends between a source select gate and a drain select gate. The system further includes a number of bit lines which are shared by the at least first and second blocks, where the bit lines are coupled to active regions of the drain select gates of the at least first and second blocks. One or more control circuits are provided to, during a first time period, bias the drain select gates of the selected block at a first non-zero level via a first transfer transistor, and bias the drain select gates of the at least one unselected block at the first non-zero level via a second transfer transistor. During a second time period which follows the first time period, the one or more control circuits concurrently: (a) bias the drain select gates of the selected block via the first transfer transistor at a second non-zero level, which is higher than the first non-zero level, and (b) float a voltage of the drain select gates of the at least one unselected block.

In another embodiment, a non-volatile storage system includes at least first and second blocks of non-volatile storage elements, where each block comprises strings of series-connected non-volatile storage element, and each string extends between a source select gate and a drain select gate. A number of bit lines are shared by the at least first and second blocks, and are coupled to active regions of the drain select gates of the at least first and second blocks. A first transfer transistor is coupled to: the drain select gates of the first block, a select gate driver, and a first block decoder. First and second block decoder drivers are also provided. A second transfer transistor is coupled to: the drain select gates of the second block, the select gate driver, and a second block decoder. A common drain select gate driver is coupled to the first and second transfer transistors. One or more control circuits concurrently: (a) couple a first voltage driver to a control gate of the first transfer transistor, to control a voltage level of the drain select gates of the first block, and (b) couple a second voltage driver, independent of the first voltage driver, to a control gate of the second transfer transistor, to control a voltage level of the drain select gates of the second block, when the first block is selected to perform an operation and the second block is unselected.

Corresponding methods, systems and computer- or processor-readable storage devices which have executable code for performing the methods provided herein may also be provided.

BRIEF DESCRIPTION OF THE DRAWINGS

FIG. 1b is an equivalent circuit diagram of the NAND string of FIG. 1a.

FIG. 2 depicts a cross-sectional view of a NAND string formed on a substrate.

FIG. 6 is a block diagram of an array of NAND flash storage elements.

FIG. 7a is a block diagram of a non-volatile memory system using single row/column decoders and read/write circuits.

FIG. 7b is a block diagram depicting one embodiment of a sense block.

FIG. 8 illustrates an example of an organization of a memory array into blocks for an all bit line memory architecture and for an odd-even memory architecture.

FIG. 14a depicts a process for operating the memory device of FIG. 11a during a programming or sense operation.

FIG. 14b depicts a process for operating the memory device of FIG. 12a during a programming or sense operation.

DETAILED DESCRIPTION

The present invention provides a memory device with reduced leakage current during programming and sense operations, and a method for operating such a memory device.

Figure 1A:
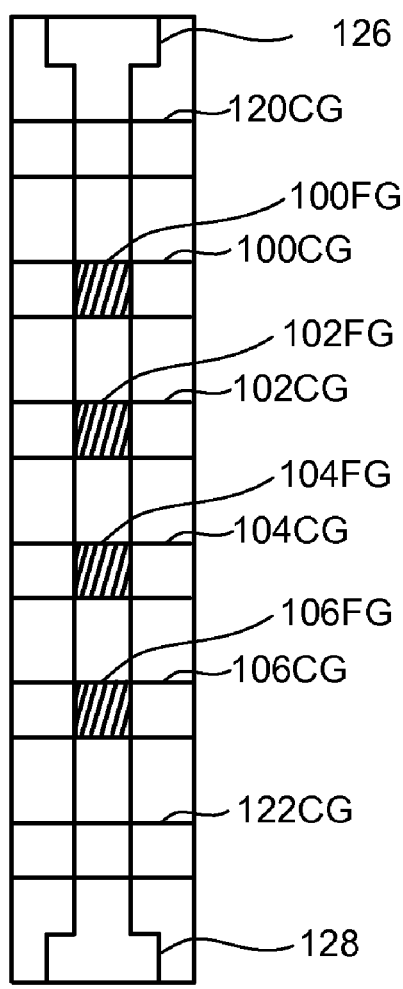
FIG. 1a is a top view of a NAND string.
Figure 1B:
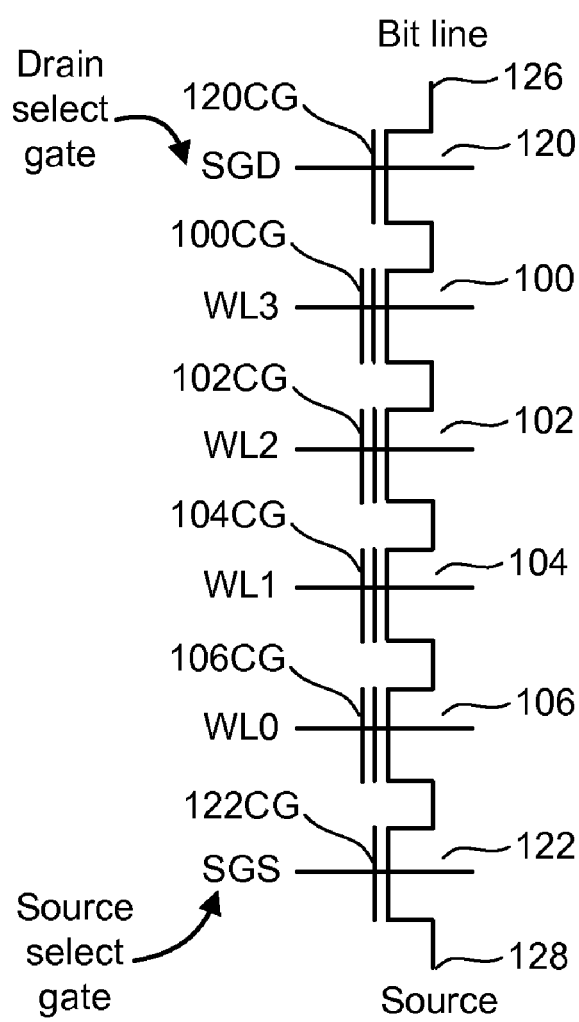

One example of a memory system suitable for implementing the present invention uses the NAND flash memory structure, which includes arranging multiple transistors in series between two select gates. The transistors in series and the select gates are referred to as a NAND string. FIG. 1a is a top view showing one NAND string. FIG. 1b is an equivalent circuit thereof. The NAND string depicted in FIGS. 1a and 1b includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1a and 1b. Select gate 120 is connected to select line SGD. Select gate 122 is connected to select line SGS.

Figure 1C:
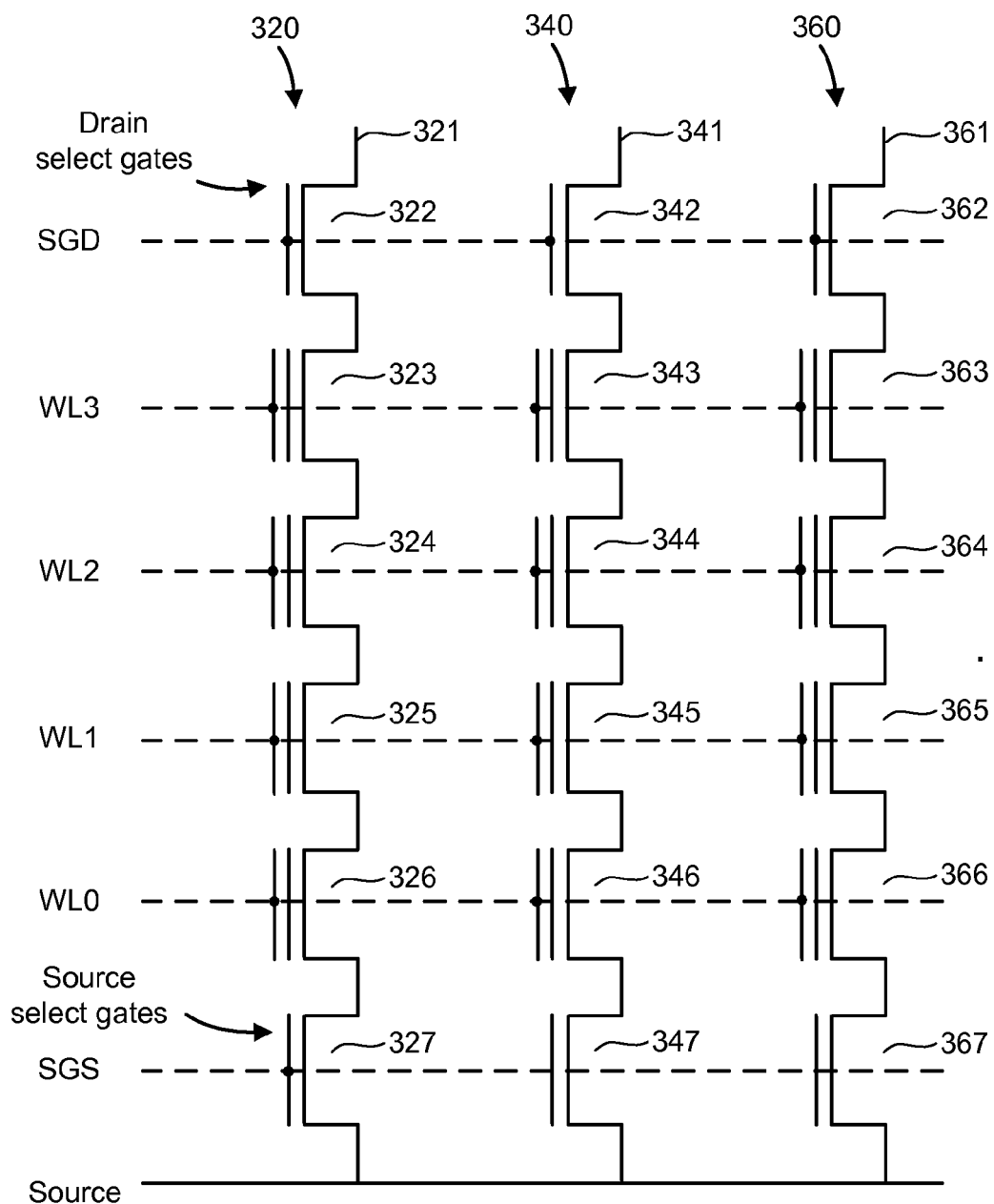
FIG. 1c is a block diagram of an array of NAND flash storage elements.

FIG. 1c is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 1c, the program voltage will also be applied to the control gates of storage elements 344 and 364.

FIG. 2 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 438. A number of source/drain regions, one example of which is source drain/region 430, are provided on either side of each storage element and the select gates 406 and 424. In one approach, the substrate 438 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively. During an erase operation, high positive voltage pulses are applied to the substrate 436 to draw charge out of the floating gates of the storage elements.

Figure 3:
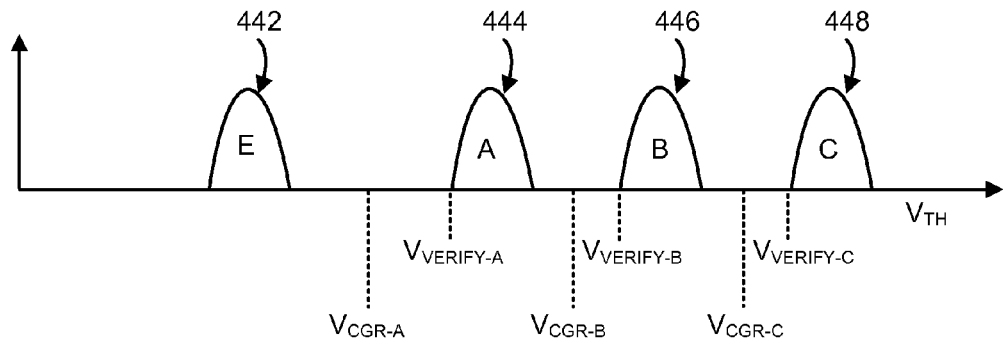
FIG. 3 depicts threshold voltage distributions of an erased state and higher data states.

FIG. 3 depicts threshold voltage distributions of an erased state and higher data states. The x-axis indicates a threshold voltage and the y-axis indicates a number of storage elements. In this example, there are four data states: an erased (E) state 442, an A state 444, a B state 446 and a C state 448. Memory devices with additional data states, e.g., eight or sixteen data states, are expected to become more common as well. An erase sequence typically includes an erase operation and a soft programming operation. Once the soft programming operation is complete, programming to higher data states can occur, such as to states A, B and C using verify levels $V_{VERIFY-A}$, $V_{VERIFY-B}$ and $V_{VERIFY-C}$, respectively. A subsequent read operation can use the levels $V_{CGR-A}$, $V_{CGR-B}$ and $V_{CGR-C}$. In this case, two bits of data, or four data states are used. Devices with, e.g., three bits of data per cell (eight states) or four bits of data per cell (sixteen states) can also be used.

Figure 4:
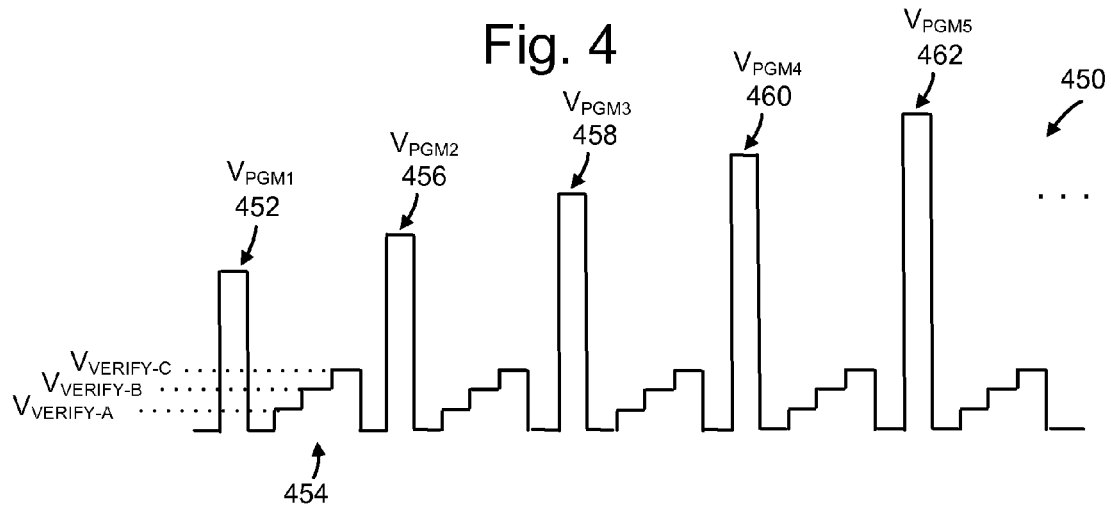
FIG. 4 depicts an example pulse train applied to the control gates of non-volatile storage elements during programming.

FIG. 4 depicts an example pulse train applied to the control gates of non-volatile storage elements during programming. The pulse train 450 includes program pulse 452 at a level of $V_{PGM1}$, program pulse 456 at a level of $V_{PGM2}$, program pulse 458 at a level of $V_{PGM3}$, program pulse 460 at a level of $V_{PGM4}$, program pulse 462 at a level of $V_{PGM5}$, and so forth. An example set of verify pulses 454 is depicted which has levels of $V_{VERIFY-A}$, $V_{VERIFY-B}$ and $V_{VERIFY-C}$. This approach depicts all bit line sensing, where verify operations are performed concurrently for storage elements of odd and even bit lines. Another approach involves applying one set of verify pulses for even bit line sensing followed by another set of verify pulses for odd bit line sensing, after each program pulse.

Figure 5:
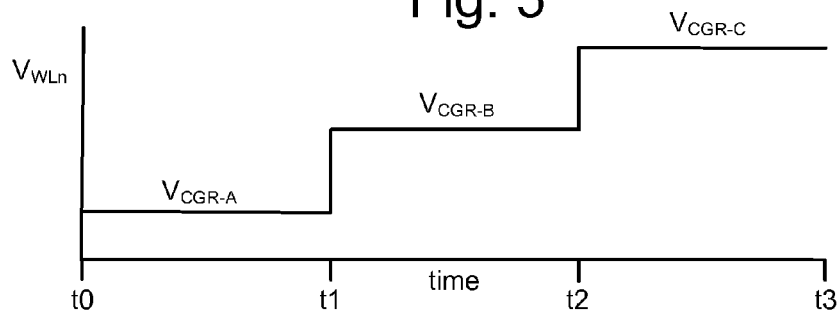
FIG. 5 depicts an example pulse train applied to the control gates of non-volatile storage elements during a read operation.

FIG. 5 depicts an example pulse train applied to the control gates of non-volatile storage elements during a read operation. The pulse train includes read levels $V_{CGR-A}$ from t0-t1, $V_{CGR-B}$ from t1-t2 and $V_{CGR-C}$ from t2-t3. During a read or verify operation, e.g., a sense operation, a sense block may be used to determine whether a selected storage element is in a conductive or non-conductive state, as discussed further in connection with FIG. 7b.

FIG. 6 illustrates an example of an array 600 of NAND storage elements, such as those shown in FIGS. 1a and 1b. Along each column, a bit line 606 is coupled to the drain terminal 626 of the drain select gate for the NAND string 650. Along each row of NAND strings, a source line 604 may connect all the source terminals 628 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

FIG. 7a is a block diagram of a non-volatile memory system using single row/column decoders and read/write circuits. The diagram illustrates a memory device 796 having read/write circuits for reading and programming a page of storage elements in parallel, according to one embodiment of the present invention. Memory device 796 may include one or more memory die 798. Memory die 798 includes a two-dimensional array of storage elements 600, control circuitry 710, and read/write circuits 765. In some embodiments, the array of storage elements can be three dimensional. The memory array 600 is addressable by word lines via a row decoder 730 and by bit lines via a column decoder 760. The read/write circuits 765 include multiple sense blocks 700 and allow a page of storage elements to be read or programmed in parallel. Typically a controller 750 is included in the same memory device 796 (e.g., a removable storage card) as the one or more memory die 798. Commands and Data are transferred between the host and controller 750 via lines 720 and between the controller and the one or more memory die 798 via lines 718.

The control circuitry 710 cooperates with the read/write circuits 765 to perform memory operations on the memory array 600. The control circuitry 710 includes a state machine 712, an on-chip address decoder 714, and a power control module 716. The state machine 712 provides chip-level control of memory operations, including controlling pre-charging. The on-chip address decoder 714 provides an address interface between that used by the host or a memory controller to the hardware address used by the decoders 730 and 760. The power control module 716 controls the power and voltages supplied to the word lines and bit lines during memory operations.

In some implementations, some of the components can be combined. In various designs, one or more of the components (alone or in combination), other than storage element array 600, can be thought of as a managing circuit. For example, one or more managing circuits may include any one of or a combination of control circuitry 710, state machine 712, decoders 714/760, power control 716, sense blocks 700, read/write circuits 765, controller 750, etc.

Appropriate data structures and control logic can be implemented in a controller memory which is external to the memory chip or on the chip, for instance, to implement the functionality described herein.

In another approach, dual row/column decoders and read/write circuits are used. Access to the memory array 600 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 600. In this way, the density of the read/write modules is essentially reduced by one half.

FIG. 7b is a block diagram depicting one embodiment of a sense block. An individual sense block 700 is partitioned into a core portion, referred to as a sense module 780, and a common portion 790. In one embodiment, there will be a separate sense module 780 for each bit line and one common portion 790 for a set of multiple sense modules 780. In one example, a sense block will include one common portion 790 and eight sense modules 780. Each of the sense modules in a group will communicate with the associated common portion via a data bus 772.

Sense module 780 comprises sense circuitry 770 that determines whether a conduction current in a connected bit line is above or below a predetermined threshold level. Sense module 780 also includes a bit line latch 782 that is used to set a voltage condition on the connected bit line. For example, a predetermined state latched in bit line latch 782 will result in the connected bit line being pulled to a state designating program inhibit (e.g., 1.5-3 V).

Common portion 790 comprises a processor 792, a set of data latches 794 and an I/O Interface 796 coupled between the set of data latches 794 and data bus 720. Processor 792 performs computations. For example, one of its functions is to determine the data stored in the sensed storage element and store the determined data in the set of data latches. The set of data latches 794 is used to store data bits determined by processor 792 during a read operation. It is also used to store data bits imported from the data bus 720 during a program operation. The imported data bits represent write data meant to be programmed into the memory. I/O interface 796 provides an interface between data latches 794 and the data bus 720.

During read or sensing, the operation of the system is under the control of state machine 712 that controls the supply of different control gate voltages to the addressed storage element. As it steps through the various predefined control gate voltages corresponding to the various memory states supported by the memory, the sense module 780 may trip at one of these voltages and an output will be provided from sense module 780 to processor 792 via bus 772. At that point, processor 792 determines the resultant memory state by consideration of the tripping event(s) of the sense module and the information about the applied control gate voltage from the state machine via input lines 793. It then computes a binary encoding for the memory state and stores the resultant data bits into data latches 794. In another embodiment of the core portion, bit line latch 782 serves double duty, both as a latch for latching the output of the sense module 780 and also as a bit line latch as described above.

It is anticipated that some implementations will include multiple processors 792. In one embodiment, each processor 792 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 792 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 794 from the data bus 720. The program operation, under the control of the state machine, comprises a series of programming voltage pulses applied to the control gates of the addressed storage elements. Each programming pulse is followed by a read back (verify) to determine if the storage element has been programmed to the desired memory state. Processor 792 monitors the read back memory state relative to the desired memory state. When the two are in agreement, the processor 792 sets the bit line latch 782 so as to cause the bit line to be pulled to a state designating program inhibit. This inhibits the storage element coupled to the bit line from further programming even if programming pulses appear on its control gate. In other embodiments the processor initially loads the bit line latch 782 and the sense circuitry sets it to an inhibit value during the verify process.

Data latch stack 794 contains a stack of data latches corresponding to the sense module. In one embodiment, there are three data latches per sense module 780. In some implementations (but not required), the data latches are implemented as a shift register so that the parallel data stored therein is converted to serial data for data bus 720, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 8 illustrates an example of an organization of a memory array into blocks for an all bit line memory architecture and for an odd-even memory architecture. Exemplary structures of memory array 600 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture 810, all the bit lines of a block can be simultaneously selected during read and program operations. Storage elements along a common word line and connected to any bit line can be programmed at the same time.

In the example provided, four storage elements are connected in series to form a NAND string. Sixty-four storage elements and two dummy storage elements are shown to be included in each NAND string as an example. One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture 800, the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, in a selected block, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Dummy word lines WL_DS (source side of NAND string) and WL_DD (drain side of NAND string) are optionally provided to isolate the neighbor word line from the associated select gate.

Figure 9A:
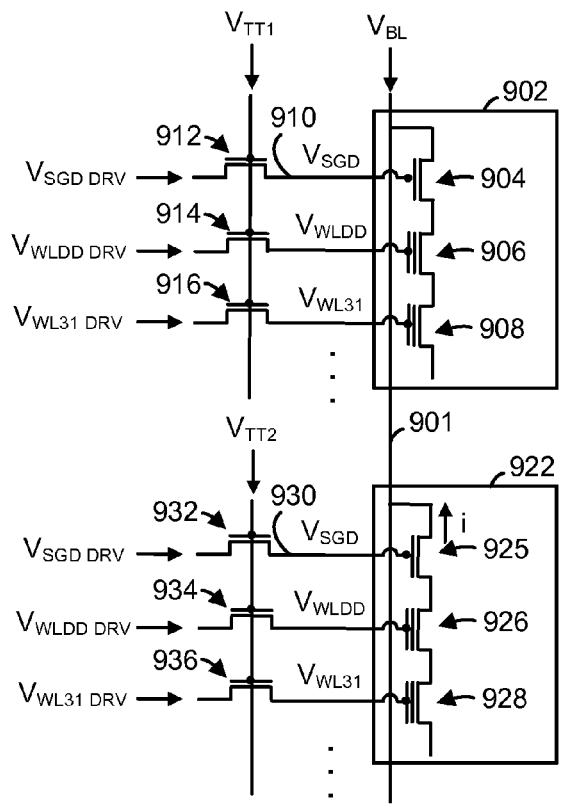
FIG. 9a depicts leakage current in an unselected block of one embodiment of a memory device.

FIG. 9a depicts leakage current in an unselected block of one embodiment of a memory device. A portion of a memory device includes a block of storage elements 902, which has been selected for performing a programming or read operation, and a block 922 which is unselected. Additional unselected blocks (not shown) are typically present as well. A portion of an example string of series-connected storage elements such as a NAND string is also depicted. A drain select gate 904 is at one end of each string. The control gates of the drain select gates of the different strings in a block are connected on a common SGD path (see FIGS. 1c and 8).

A control gate of the drain select gate 904 communicates with a transfer transistor (TT) or transfer gate 912 via a drain select gate line 910. A driving voltage $V_{SGD\,DRV}$ is provided to an input node of the transfer transistor 912, and a voltage $V_{TT1}$ is provided to a control gate of the transfer transistor 912, so that a voltage $V_{SGD}$ results at an output node of the transfer transistor 912. The transfer transistor 912 may be an nMOSFET, for example, which has a threshold voltage $V_{TH}$ in which case the input node at the left hand side is the drain and the output node at the right side is the source.

Each storage element is similarly connected at its control gate to a respective transfer transistor to receive a desired voltage. For example, dummy storage element 906 is connected to a transfer transistor 914 to receive $V_{WLDD}$. The transfer transistor 914 receives $V_{TT1}$ at its control gate and $V_{WLDD\,DRV}$ at its input node. Storage element 908 is connected to a transfer transistor 916 to receive $V_{WL31}$. The transfer transistor 916 receives $V_{TT1}$ at its control gate and $V_{WL31\,DRV}$ at its source node. The remaining storage elements (not shown) are similarly connected to respective transfer gates.

Similarly, in the unselected block 922, drain select gate 925 is connected to a transfer transistor 932 via drain select line 930 to receive $V_{SGD}$. The transfer transistor 932 receives a voltage $V_{TT2}$ at its control gate and $V_{SGD\,DRV}$ at its input node. A common driver for $V_{SGD\,DRV}$ may be used for the selected and unselected blocks in one implementation. Dummy storage element 926 is connected to a transfer transistor 934 to receive $V_{WLDD}$. The transfer transistor 934 receives $V_{TT2}$ at its control gate and $V_{WLDD\,DRV}$ at its input node. Storage element 928 is connected to a transfer transistor 936 to receive $V_{WL31}$.

The transfer transistor 936 receives $V_{TT2}$ at its control gate and $V_{WL31\,DRV}$ at its input node. The remaining storage elements (not shown) are similarly connected to respective transfer gates.

Figure 9B:
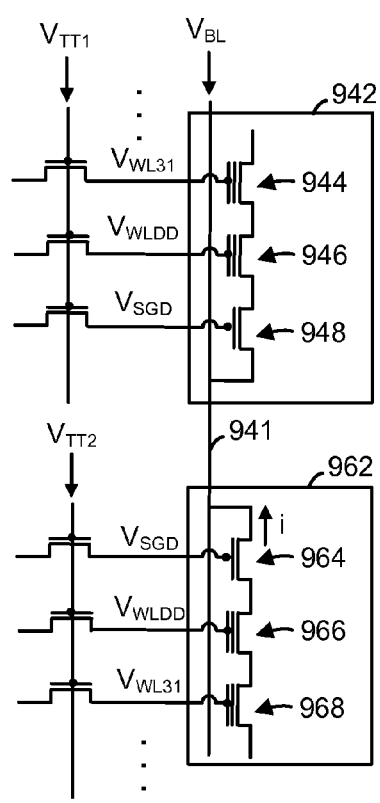
FIG. 9b depicts leakage current in an unselected block of another embodiment of a memory device.

FIG. 9b depicts leakage current in an unselected block of another embodiment of a memory device. In another possible layout, the strings are fabricated drain end-to-drain end so that a selected block 942 includes drain select gate 948, dummy storage element 946 and storage element 944, and an unselected block 962 includes drain select gate 964, dummy storage element 966 and storage element 968.

In the current non-volatile (e.g., NAND) technology, to select a block for programming, a drain-side select gate transistor in selected block is turned on by applying a gate voltage, $V_{SGD}$, which may be at a level of a system supply voltage $V_{DD}$, e.g., 2.5 V, while $V_{SGD}$ is typically 0 V for an unselected block to shut its NAND strings off. The bit line, however, is connected to contacts or active regions of the drain select gates in both selected and unselected blocks within one plane of a memory device to reduce the size. For example, in FIG. 9a, bit line 901 is connected to an active region of the drain select gate 904 of the selected block 902 and to an active region of the drain select gate 925 of the unselected block 922. Similarly, in FIG. 9b, bit line 941 is connected to an active region of the drain select gate 948 of the selected block 942 and to an active region of the drain select gate 964 of the unselected block 962.

Figure 10A:
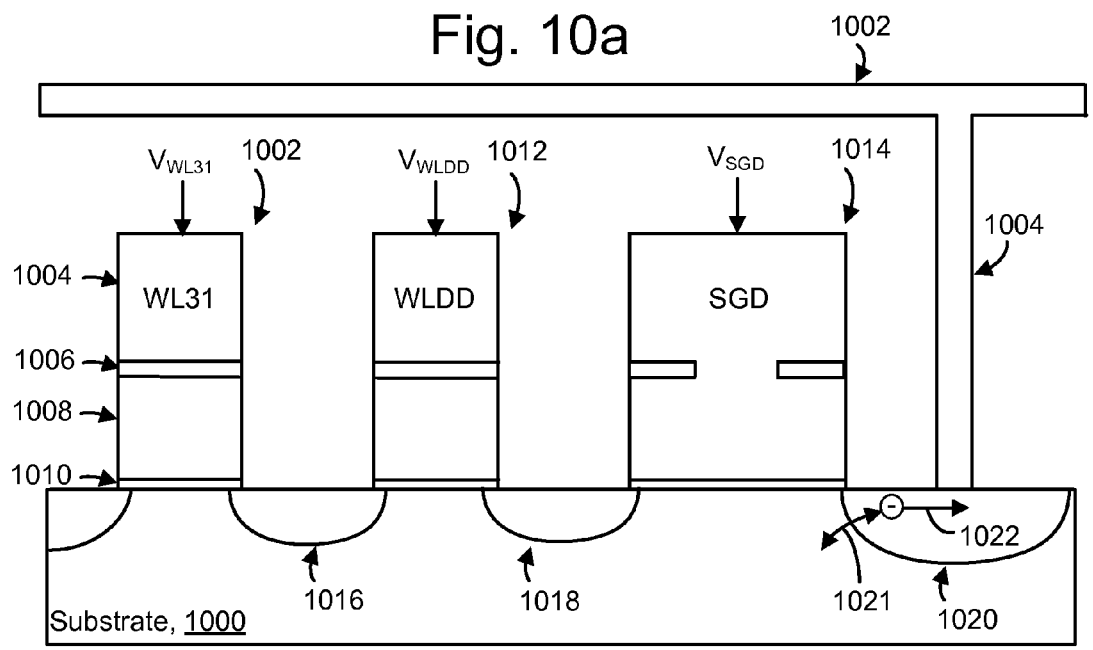
FIG. 10a depicts leakage current at an active region of a drain select gate in a NAND string.

FIG. 10a depicts leakage current at an active region of a drain select gate in a NAND string. A set of storage elements, including storage elements 1002 and 1012, in addition to drain select gate 1014, are formed on a substrate 1000. The example storage element 1002 includes a gate oxide 1010, floating gate 1008, interlayer dielectric 1006 and a control gate 1004 which is a portion of a word line which extends across multiple storage elements. Active regions include source/drain regions 1016 and 1018 and region 1020. These regions are typically doped so that they can conduct a current. A bit line 1002, typically formed from a metal layer, includes a contact or via portion 1004, also typically metal, which interconnects the bit line with the active region 1020, which is the drain of the drain-side select gate 1014.

As NAND technology is scaled down resulting in more halo implantation, short channel effect, and abrupt junctions, this global bit line connection scheme can cause a gate induced drain leakage (GIDL) effect near the drain-side select gate 1014 of unselected blocks, as depicted by arrows 1021 and 1022. Moreover, since the total number of NAND strings in a block, and the number of blocks in one plane is typically more than one thousand, the total bit line leakage current can be very significant. This will affect the fundamental increase of noise in the bit line and this, in return, may affect the threshold voltage and its distribution in a NAND string in the selected block, as every NAND string in one plane is hooked up to global bit line at the drain contact of the drain-side select gate which runs toward a sense amplifier.

Traditionally, junction optimization has been one approach to relax electric field crowding near the drain edge by adjusting geometry near the overlap region of the gate and drain, and optimize the doping level by ion implantation which controls the number and location of defects as a band-to-band tunneling medium. However, additional techniques are needed.

Figure 10B:
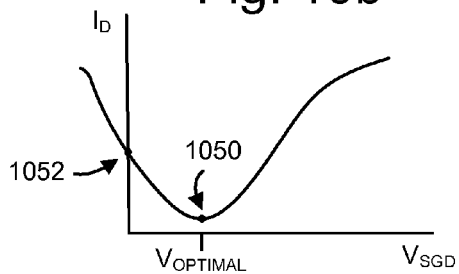
FIG. 10b depicts a leakage current vs. gate voltage relationship for a drain select gate in a NAND string.

FIG. 10b depicts a leakage current vs. gate voltage ($V_G$) relationship for a drain select gate in a NAND string. A technique herein applies a small amount of gate voltage to the drain select gate in an unselected block during programming instead of 0 V. From the GIDL point of view, the drain current decreases until certain point as $V_G$ reduces and then suddenly increases back with decreasing $V_G$. This minimal point of drain current (operating point 1050) happens in a range of roughly a few tenths of Volts, e.g., 0.0-0.3 V, 0.1-0.3 V or 0.1-0.5 V. In some cases, a gate voltage ($V_{OPTIMAL}$) of approximately 0.2 V is optimal. The optimal value can be determined for different memory devices through testing, in which the leakage current is measured for different values of $V_G$. The leakage current can be measured, e.g., by applying a gate voltage of $V_{SG}$ for all blocks, where there is no selected block, sensing the bit line leakage current with a bit line leak check mode, with a longer hold time than normal, and determining a number of failed bits. The number of failed bits corresponds generally to the leakage current. In this way, we can select an optimized gate voltage. This can be done during testing, for each chip. Or, based on evaluation of several chips, the optimal gate voltage can be identified can implemented in other chips.

$V_{OPTIMAL}$ is typically less than the level ($V_{SG}$) which is used during programming or sensing operations, such as 2.5 V (for $V_{SGD}$) during programming or 4.5 V (for $V_{SGD}$ or $V_{SGS}$) during sensing. The memory devices can then be configured to apply the optimal non-zero gate voltage to the control gates of the drain select gates of an unselected block during programming or sensing to minimize drain current caused by GIDL.

The small amount of gate voltage applied to the drain select gate for the unselected block does not affect read disturb or write disturb in the unselected block, so there is no reliability concern.

With this approach, the total bit line leakage current caused by GIDL of every NAND strings in the unselected blocks could be minimized by applying appropriate voltages, resulting is significant savings in power consumption as well as other performance benefits. Note that current is reduced form the level at operating point 1052, which would be seen with $V_{SGD}$=0 V to operating point 1050. This approach is expected to be increasingly valuable as the NAND memory devices are shrunk down further as the technology is scaled down, and current leakage effects become more detrimental.

Figure 10C:
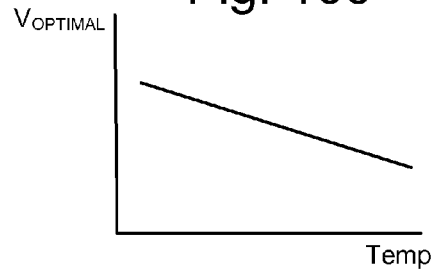
FIG. 10c depicts a temperature dependency of $V_{OPTIMAL}$, an optimal bias voltage of a drain select gate of an unselected block.

Note that $V_{OPTIMAL}$ may differ under different conditions such as temperature, and type of operation, e.g., programming, verifying or reading. A table can be formed which identifies $V_{OPTIMAL}$ for the different conditions. The table can then be accessed to set the appropriate value, providing a further optimization and minimization of leakage current. Regarding temperature dependence, the SGD current curve has temperature dependence, where a higher temperature results in more leakage current. So, the optimized gate voltage can be optimized with temperature dependence. An example approach is indicated in FIG. 10c, where $V_{OPTIMAL}$ is lower for higher temperatures.

Various techniques are known for providing temperature-compensated signals generally. One or more of these techniques can be used to provide a temperature-dependency for $V_{OPTIMAL}$. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. Any of these techniques, as well as any other known techniques, can be used.

Figure 11A:
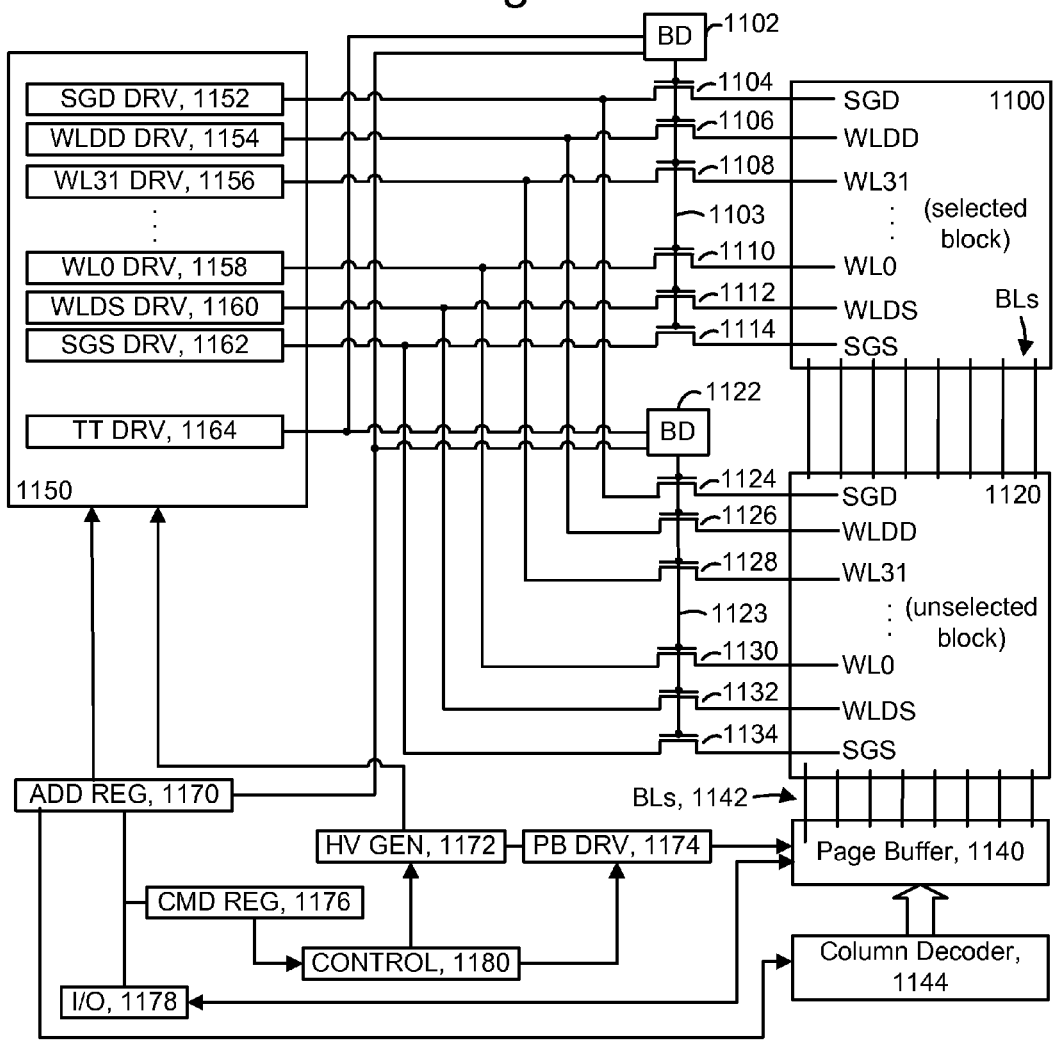
FIG. 11a depicts a memory device having a common transfer transistor driver for selected and unselected blocks.

FIG. 11a depicts a memory device having a common transfer transistor driver for selected and unselected blocks. Each block of storage elements is associated with a set of transfer transistors, in one possible embodiment. For example, block 1100, which is the selected block in this example, e.g., a block in which a programming or sense operation is to take place, includes a drain-side select gate (SGD) connected to a transfer transistor 1104, a drain-side dummy word line (WLDD) connected to a transfer transistor 1106, a word line (WL31) connected to a transfer transistor 1108, intermediate word lines WL30-WL1 (not shown) connected to respective transfer transistors (not shown), a word line (WL0) connected to a transfer transistor 1110, a source-side dummy word line (WLDS) connected to a transfer transistor 1112, and a source-side select gate (SGS) connected to a transfer transistor 1114. The control gate of each transfer transistor of the block 1100 is connected to a block decoder (BD) 1102 via a common path 1103. The BD 1102 receives a voltage from a transfer transistor driver (TT DRV) 1164 and a control signal from an address register (ADD REG) 1170. The control signal includes an address. If the address matches an address of the BD 1102, the BD 1102 acts as a conductive switch which passes the voltage to the control gates of the associated transfer transistors via path 1103. If the address does not match the address of the BD 1102, the BD 1102 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 1150. Each driver may include an on-chip charge pump. For example, the transfer transistor 1104 is connected to a drain select gate driver (SGD DRV) 1152, the transfer transistor 1106 is connected to a dummy word line driver (WLDD DRV) 1154, the transfer transistor 1108 is connected to the word line driver (WL31 DRV) 1156, ..., the transfer transistor 1110 is connected to the word line driver (WL0 DRV) 1158, the transfer transistor 1112 is connected to the source side dummy word line driver (WLDS DRV) 1160, and the transfer transistor 1114 is connected to the source select gate driver (SGS DRV). Each voltage driver can be independently controlled to provide a desired output voltage.

A similar arrangement is used for the example unselected block 1120, which includes a transfer transistor 1124 connected to SGD and SGD DRV 1152, a transfer transistor 1126 connected to WLDD and WLDD DRV 1154, a transfer transistor 1128 connected to WL31 and WL31 DRV 1156, ..., a transfer transistor 1130 connected to WL0 and WL0 DRV 1158, a transfer transistor 1132 connected to WLDS and WLDS DRV 1160, and a transfer transistor 1134 connected to SGS and SGS DRV 1162. The control gates of the transfer transistors of the unselected block 1120 are connected to a respective block decoder (BD) 1122 via a common path 1123. The BD 1122 is also connected to the TT DRV 1164 to receive a voltage, and to the address register 1170 to receive a control signal which instructs the BD 1122 to pass or not pass the voltage to the control gates of the associated transfer transistors via path 1123. The address register (ADD REG) 1170 also communicates with the voltage drivers in the set of high-voltage voltage drivers 1150.

A number of bit lines (BLs) 1142 extend across the selected block 1100 and the unselected block 1120 (and across additional unselected blocks, not shown, in some implementations) and into a page buffer 1140, which is responsive to a column decoder 1144. The page buffers stores data which is written into, or read from, a selected word line of the selected block. During an operation of the memory device, the address register 1170 provides a data load command to an input-output buffer 1178 and to a command register 1176. The input-output buffer 1178 provides the command to the page buffer 1140. The command register 1176 provides a command to a control circuit 1180, which instructs a high voltage generator 1172 to control the voltage drivers 1150 at appropriate levels. Typically, during programming, the driver of the selected word line provides a programming level voltage, such as 12-26 V while the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ-PASS}$. The control 1180 also instructs the page buffer driver (PB DRV) 1174 to control the page buffer 1140. The address register 1170 also communicates with the column decoder 1144.

Figure 11B:
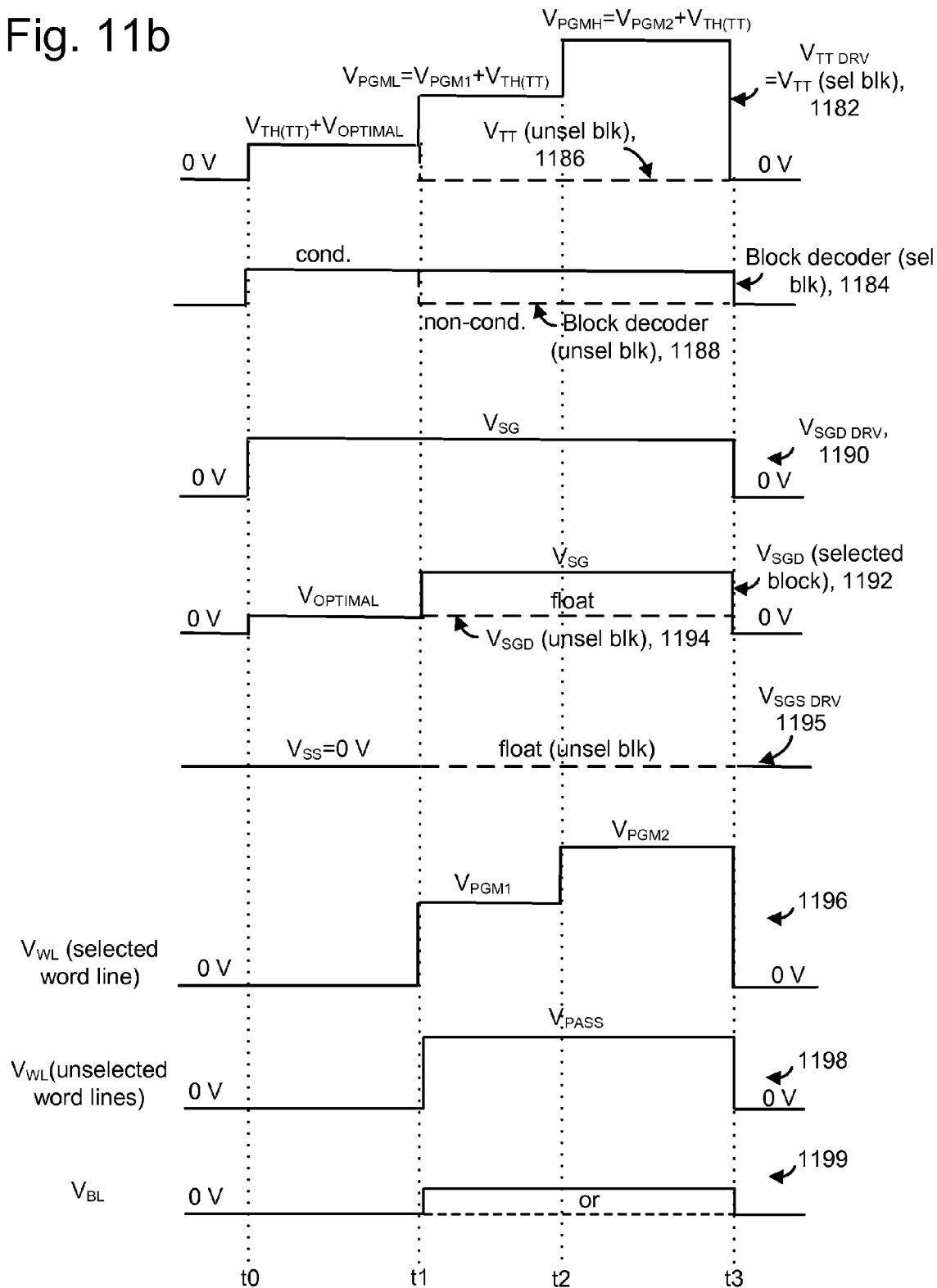
FIG. 11b depicts waveforms for operating the memory device of FIG. 11a during a programming operation.

FIG. 11b depicts waveforms for operating the memory device of FIG. 11a during a programming operation. In the example implementation of FIG. 11a, the voltage drivers 1150 are shared among multiple blocks. This results in certain constraints in driving the blocks. In one possible driving scheme, a pre-charge voltage is applied to the drain select gates of the selected and unselected blocks, prior to applying a programming or read voltage to a selected word line of the selected block. This occurs in a pre-charge time period t0-t1. Between t1-t3, the voltage at the drain select gate of the unselected block is cut off so that the voltage floats at the pre-charge level. The pre-charge level can advantageously be set at $V_{OPTIMAL}$, as discussed in connection with FIG. 10b, to minimize current leakage of the unselected blocks.

Waveform 1182 depicts the voltage output of the transfer transistor driver TT DRV 1164, which is common to the selected and unselected blocks. Between t0-t1, the voltage is at a level which exceeds the threshold voltage of the transfer transistors, $V_{TH(TT)}$, by a certain margin, which is the optimal gate voltage for the transfer transistors, e.g., $V_{OPTIMAL}$. Thus, $V_{TT\ DRV}=V_{TH(TT)}+V_{OPTIMAL}$. In one example, $V_{OPTIMAL}$ is about 0.2 V, and $V_{TH(TT)}$ is about 1.0 V, so $V_{TT\ DRV}=1.2$ V. The block decoder 1102 of the selected block is controlled to be in an open (conductive) state, as indicated by waveform 1184, so that TT DRV 1164 is connected to the control gates of the transfer transistors of the selected block 1100.

For the unselected block, the block decoder is in the open (conductive) position from t0-t1, and closed (non-conductive) between t1-t3, as indicated by waveform 1188. As a result, $V_{TH(TT)}+V_{OPTIMAL}$ is also provided to the control gates of the transfer transistors of the unselected block between t0-t1 (waveform 1186). An output of the drain select gate driver $V_{SGD\ DRV}$ can be at a level of $V_{SG}$, e.g., 2.5 V, from t0-t1 (waveform 1190). However, $V_{SGD}$ for the selected block (waveform 1192) and the unselected block (waveform 1194) is $V_{OPTIMAL}$, due to having $V_{TH(TT)}+V_{OPTIMAL}$ at the control gate of the transfer transistors 1104 and 1124. Note that $V_{SGD\ DRV}$ generally cannot be set at $V_{OPTIMAL}$ since $V_{SGD\ DRV}$ needs to be at an appropriate level for the selected block, so that the drain select gates are open or closed at appropriate times for different NAND strings based on $V_{SGD}$ and the bit line voltages. The appropriate level of $V_{SGD}$ for the selected block is at least as high as the threshold voltage of the SGD transistor, which is generally higher than $V_{OPTIMAL}$, which is set based on different concerns. The technique provided herein satisfies these constraints by providing $V_{SGD}$ at a small level which can be less than the threshold voltage of the SGD transistor. Thus, $V_{OPTIMAL}$ can be a first non-zero level which is less than a threshold voltage of the drain select gates of the selected and unselected blocks, and $V_{SG}$ can be a second non-zero level which is greater than the threshold voltage of the drain select gates. An example threshold voltage of the drain select gates is 1 V.

The output (source node) of the transfer transistors 1104 and 1124 is limited by the gate voltage, even though the drain node voltage provided by SGD DRV 1152 is higher, at $V_{SG}$. Also, between t0-t1, $V_{SGS\ DRV}$ is set to a steady state value $V_{SS}$ such as 0 V (waveform 1195). Also, $V_{SGS\ DRV}=V_{SGS}$. The word line voltages and the bit line voltage are at 0 V (waveforms 1196, 1198 and 1199). $V_{SGS}=0$ V from t0-t3. Waveforms 1196 and 1198 also represent the respective word line driver output levels.

At t1, the pre-charge period ends. TT DRV is commanded to output a higher voltage, such as a lower programming voltage $V_{PGML}=V_{PGM1}+V_{TH(TT)}$, between t1-t2 (waveform 1182). In this example, the programming voltage is raised in two steps to avoid an abrupt change. It is also possible to raise it in one step only. This voltage is passed to the transfer transistors of the selected block (since the block decoder is open, per waveform 1184), but not to the unselected block (since the block decoder is closed, per waveform 1186). $V_{SGD\ DRV}$ continues at a level such as $V_{SG}$ (waveform 1190). As a result, $V_{SGD}=V_{SG}$ for the selected block (waveform 1192), since the drain node voltage of the transfer transistor 1104 carries over to the source node when the gate voltage is sufficiently high. For the unselected block, $V_{SGD}$ floats at the pre-charge level at or near $V_{OPTIMAL}$ since the respective transfer transistor is cutoff, and $V_{SGS}$ floats at or near $V_{SS}$. For the selected block, $V_{SGS}$ is driven at $V_{SS}$. If the respective transfer transistor of the drain select gate of the unselected block was not cutoff, the higher voltage of $V_{PGML}$ would be seen, which is undesirable.

Also during t1-t2, the selected word line voltage is raised to $V_{PGM1}$ (waveform 1196) due to the application of $V_{PGM1}+V_{TH(TT)}$ on the control gate of the associated transfer gate and $V_{PGM1}$ on the drain node of the associated transfer gate (as provided by the corresponding word line driver). The unselected word line voltage is raised to a level of $V_{PASS}$ (waveform 1198) due to the application of $V_{PASS}$ on the drain node of the associated transfer gate (as provided by the corresponding word line driver). $V_{BL}$ (waveform 1199) can be at 0 V or at a non-zero level, such as about 0.5-1.0 V, depending on whether the associated NAND string is being programmed or inhibited, respectively. A partial inhibit scheme may be used as well for a NAND string which is being programmed. From t2-t3, a second, higher step of the program voltage is applied. Specifically, $V_{PGMH}=V_{PGM2}+V_{TH(TT)}$ is provided by TT DRV (waveform 1182), and the output of the corresponding word line driver is raised to $V_{PGM2}$, so that $V_{PGM2}$ is seen on the selected word line (waveform 1196). After t3, the voltages are brought back to a nominal steady state condition. Note that the process of FIG. 11b can be repeated in iterations of a programming operation as each successive program pulse is applied. One or more verify operations may also be carried out after each program pulse, as indicated in FIG. 4.

Figure 12A:
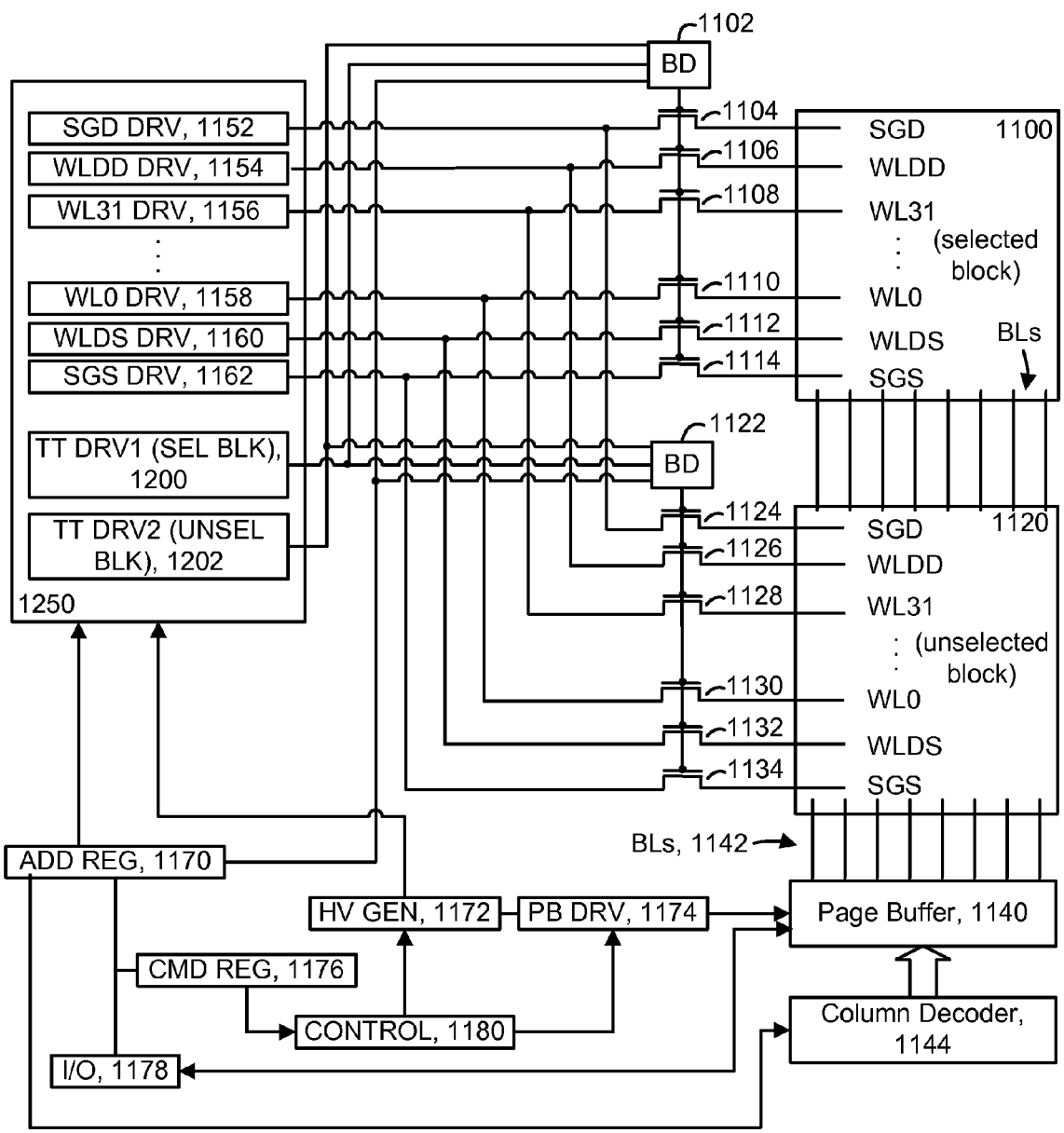
FIG. 12a depicts a memory device having separate transfer transistor drivers for selected and unselected blocks.

FIG. 12a depicts a memory device having separate transfer transistor drivers for selected and unselected blocks. The memory device of FIG. 12a differs from the device of FIG. 11a in that separate transfer transistor drivers 1200 and 1202 are provided for the selected block 1100 and the unselected block 1120, respectively, in the set of voltage drivers 1250.

The use of an additional transfer transistor driver provides greater flexibility and control without adding significant additional complexity or cost. In this case, each block decoder can be controlled to pass a voltage from the driver 1200, a voltage from the driver 1202, or 0 V, to the control gates of the respective transfer transistors. The driver 1202 may be used concurrently to drive multiple unselected blocks as well.

Figure 12B:
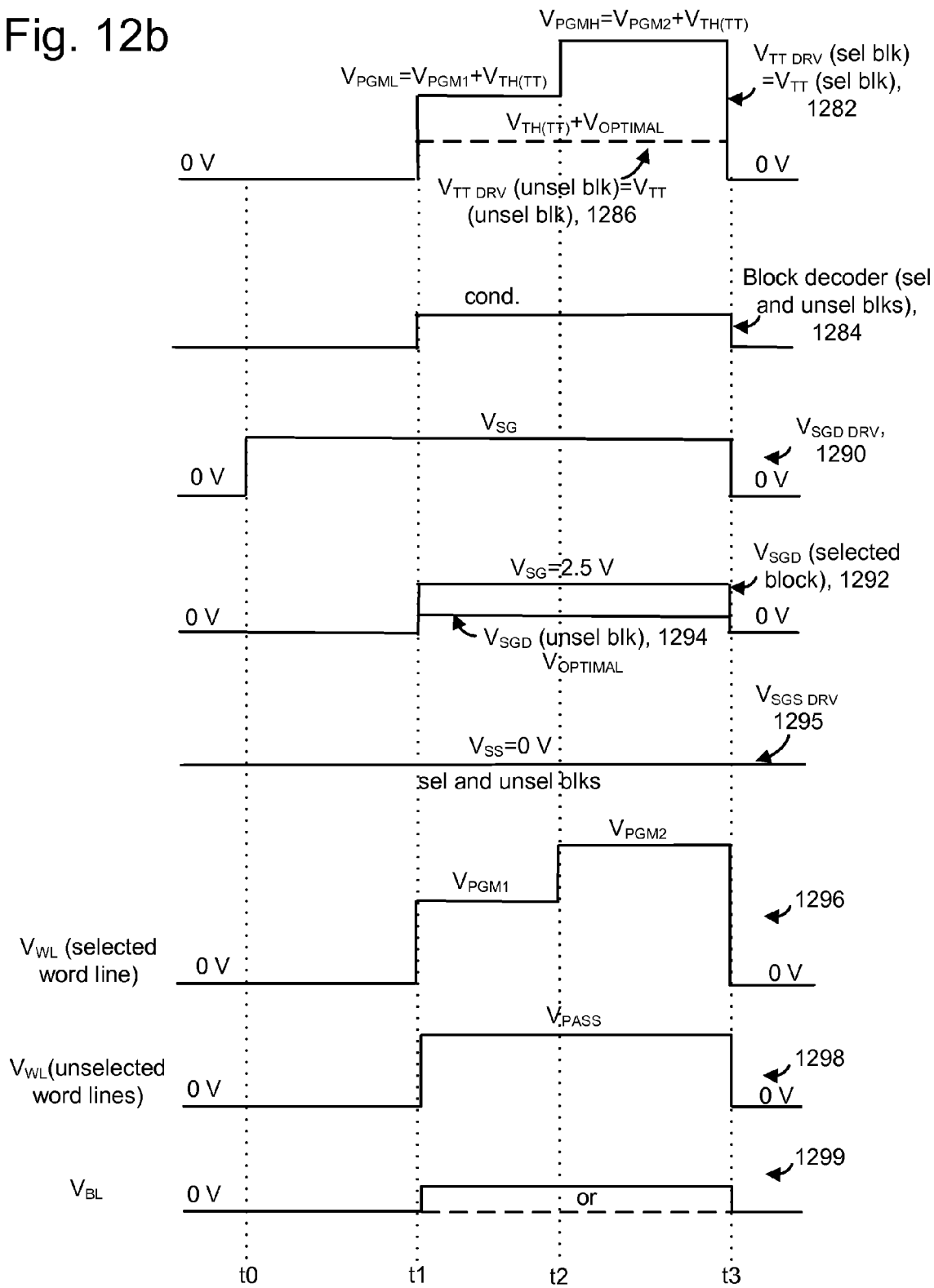
FIG. 12b depicts waveforms for operating the memory device of FIG. 12a during a programming operation.

FIG. 12b depicts waveforms for operating the memory device of FIG. 12a during a programming operation. Here, there is no pre-charge of the drain select gates at t0-t1 before applying the programming voltage at t2-t3. The time period t0-t1 in practice would not be needed, resulting in a time savings compared to the technique of FIG. 11b. For the selected block, the block decoder is in the open (conductive) position from t1-t3 (waveform 1284) so that a voltage $V_{PGML}$ from the respective transfer gate driver (TT DRV SEL) is passed to the transfer gates (waveform 1282). For the unselected block, the respective block decoder is also in the open (conductive) position between t1 and t3 (waveform 1288) so that a voltage $V_{TH(TT)}+V_{OPTIMAL}$ from the respective transfer gate driver (TT DRV UNSEL) is passed to the transfer gates (waveform 1286). $V_{SGD\_DRV}$, which is common to the selected and unselected blocks, is set to $V_{SG}$ as before (waveform 1190), so that $V_{SGD}$ for the selected block is at $V_{SG}$ (waveform 1292). At waveform 1294, $V_{SGD}$ is at $V_{OPTIMAL}$ due to the application of $V_{TH(TT)}+V_{OPTIMAL}$ on the respective transfer gate. Thus, the drain select gate can be driven at $V_{OPTIMAL}$ rather than being floated, as was done in FIG. 11b. This provides greater control. Waveforms 1196, 1198 and 1199 are the same as in FIG. 11b. $V_{SGS\_DRV}$ is driven at $V_{SS}$ for both the selected and unselected blocks (waveform 1295).

Figure 12C:
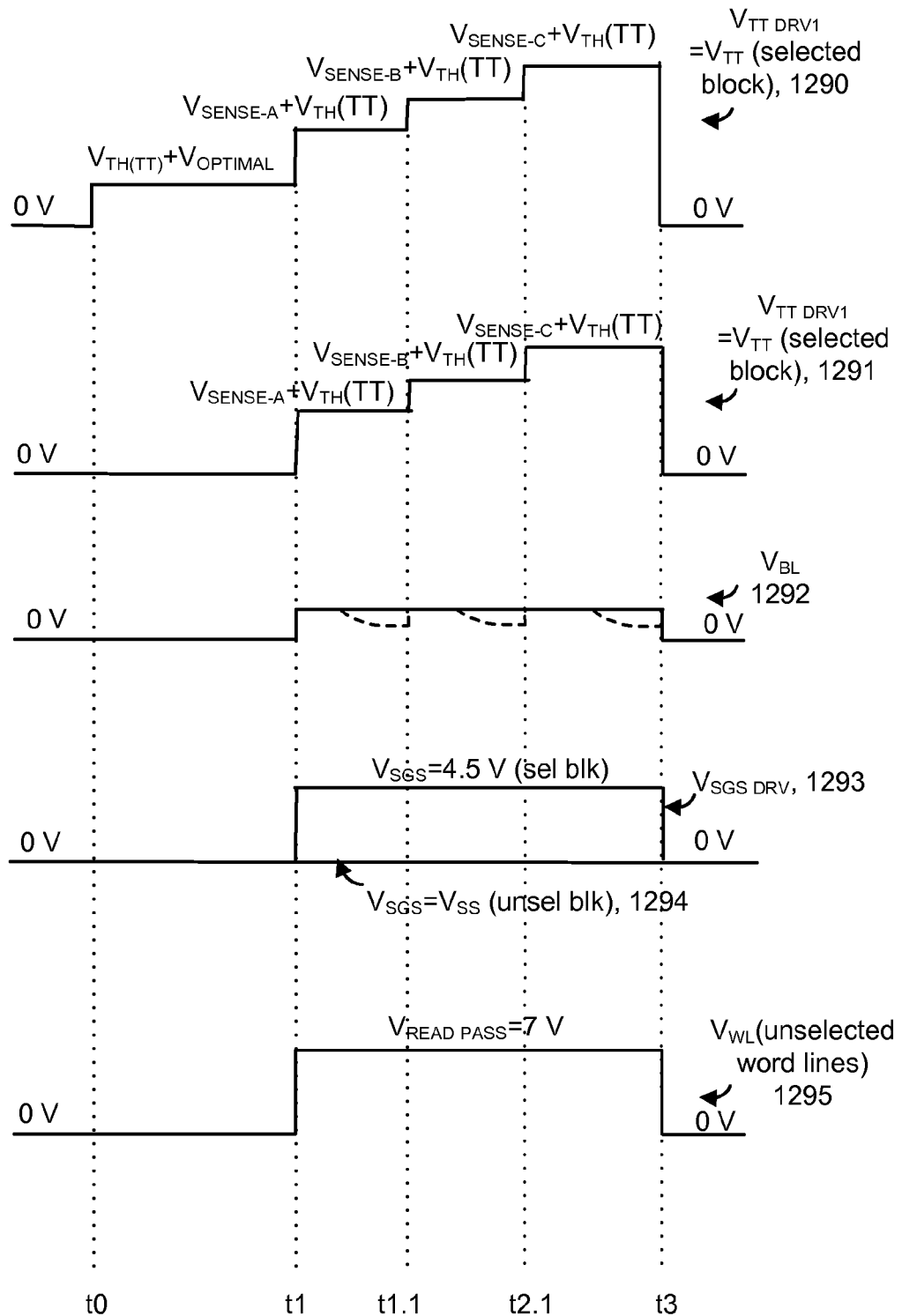
FIG. 12c depicts waveforms for operating the memory device of FIG. 11a or FIG. 12a during a sense operation.

FIG. 12c depicts waveforms for operating the memory device of FIG. 11a or FIG. 12a during a sense operation. The time points t1, t1 and t3 correspond generally to the time points in FIG. 11b and 12b. Waveform 1290 is similar to waveform 1182 except that the voltage levels from t1-t3 correspond to sensing levels instead of programming levels. For example, a voltage for sensing the A state may be applied from t1-t1.1, a voltage for sensing the B state may be applied between t1.1 and t2.1, and a voltage for sensing a C state may be applied between t2.1 and t3. The waveform 1290 may be used with the other waveforms of FIG. 11b, except $V_{BL}$ may differ, as provided by waveform 1292, and $V_{SGS}$ may be at a higher level than during programming, such as 4.5 V (waveform 1293), and a read pass voltage of e.g., 7 V is applied to the unselected world line of the selected block (waveform 1295). $V_{SGS}=V_{SS}$ for the unselected block (waveform 1294). The bit line voltage as depicted by waveform 1299 indicates that a non-zero bit line voltage may be applied during sensing. The dash lines indicate that the bit line voltage may drop during the sensing operation, in some implementations, as discussed in connection with FIG. 7b. Waveform 1291 is similar to waveform 1282, except that the program voltage levels are replaced by different sense (read or verify) voltage levels.

Figure 13A:
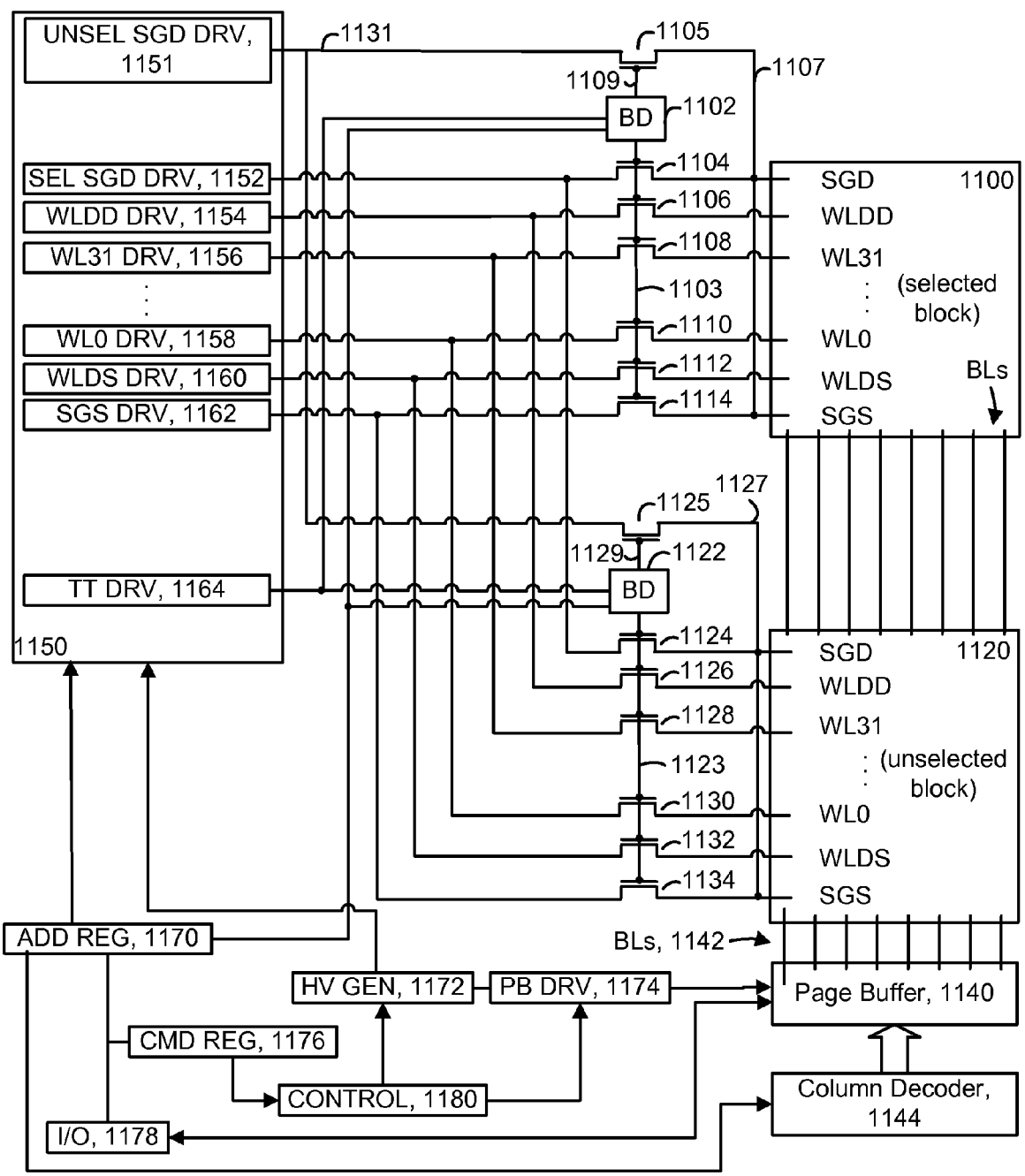
FIG. 13a depicts a memory device having a common transfer transistor driver, and separate drain select gate voltage drivers for selected and unselected blocks.

FIG. 13a depicts a memory device having a common transfer transistor driver, and separate drain select gate voltage drivers for selected and unselected blocks. The voltage driver 1152 is a dedicated driver for the selected block, and the voltage driver 1151 is a dedicated driver for the one or more unselected blocks. This approach uses additional select gate transfer or switch transistors 1105 and 1125 to selectively couple an unselected gate voltage driver 1151 to the SGD and SGS line of each block. Block decoder 1102 provides a voltage to the control gate of the transistor 1105 on a line 1109 to make the transistor 1105 conductive to allow a voltage on line 1131 to pass to line 1107, or to make the transistor 1105 non-conductive to prevent the voltage on line 1131 from passing to line 1107. Similarly, block decoder 1122 provides a voltage to the control gate of the transistor 1125 on a line 1129 to allow a voltage on line 1131 to pass to line 1127 or not. The block decoders can obtain the voltage locally, such as from a local power supply, at a level of $V_{DD}$ or 0 V, for instance, or from another driver/component.

During programming, the waveforms of FIG. 11b are applied except the select gates of the unselected block are driven at 0 V, for instance, instead of floated. Specifically, for the selected block 1100, the driver 1151 outputs 0 V on line 1131, and the transfer transistor 1105 is cutoff by applying 0 V on line 1109. The voltage on line 1107 is provided via the SGS transfer transistor 1114 since this is a "no drive" situation for line 1107 of the selected block. For the unselected block 1120, the transfer transistor 1125 is made conductive by applying, e.g., a power supply voltage $V_{DD}$ such as 2.5 V on line 1129, so that the 0 V on line 1131 is passed to line 1127.

During an erase, for the selected block 1100, the driver 1151 outputs $V_{DD}$ on line 1131, and the transfer transistor 1105 is cutoff by applying $V_{DD}$ on line 1109 so that the voltage on line 1107 floats. This is a "no drive" situation for line 1107 of the selected block. For the unselected block 1120, the transfer transistor 1125 is also cutoff by applying $V_{DD}$ on line 1129, so that the voltage on line 1127 floats. This is a "no drive" situation for line 1127 of the unselected block.

During a sense operation (read or verify), for the selected block 1100, the driver 1151 outputs an optimal voltage such as ~0.2 V on line 1131, and the transfer transistor 1105 is cutoff by applying 0 V on line 1109. The voltage on line 1107 therefore floats. This is a "no drive" situation for line 1107 of the selected block. For the unselected block 1120, the transfer transistor 1125 is made conductive by applying, e.g., $V_{DD}$ on line 1129, so that the ~0.2 V on line 1131 is passed to line 1127.

Figure 13B:
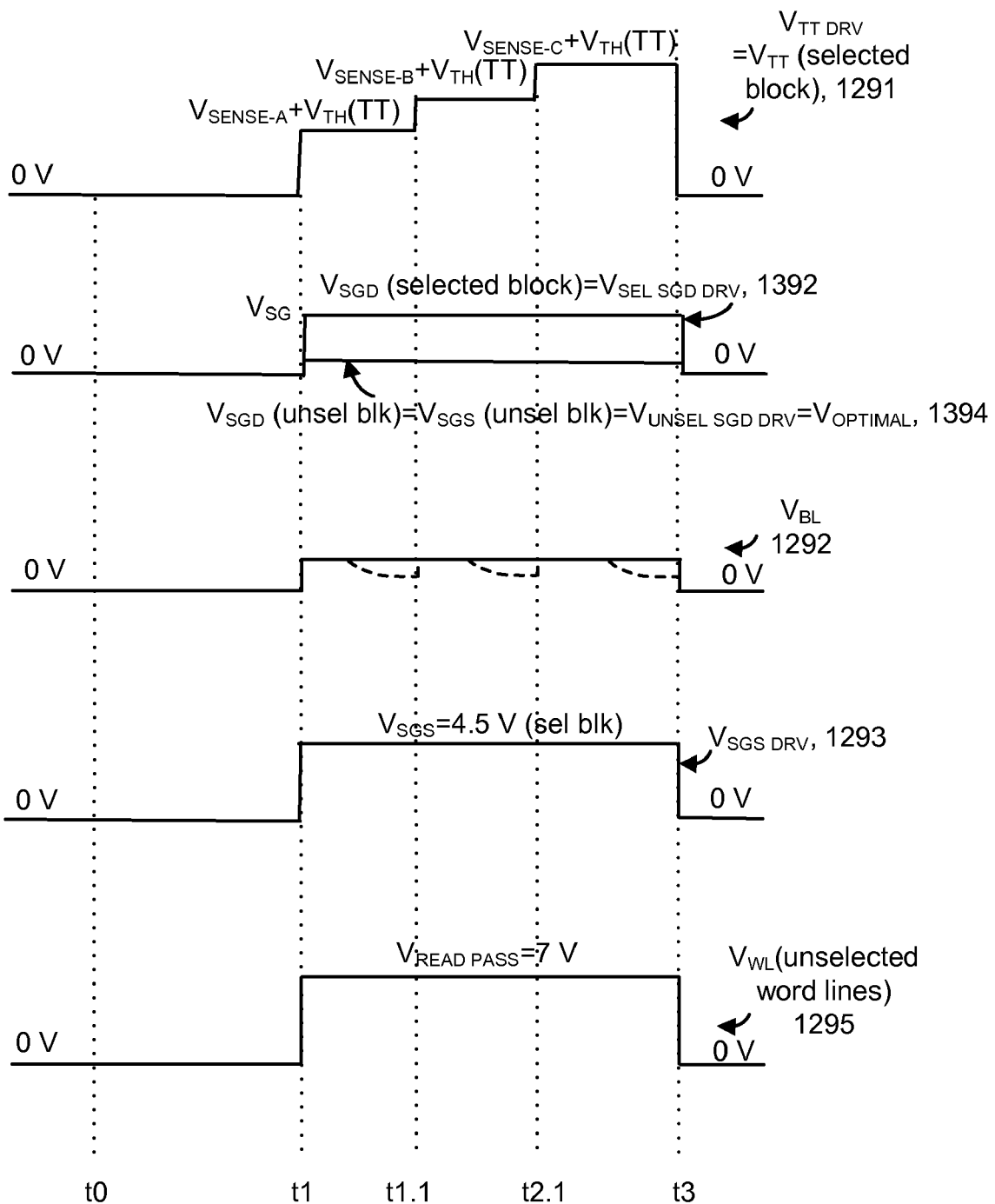
FIG. 13b depicts waveforms for operating the memory device of FIG. 13a during a sense operation.

FIG. 13b depicts waveforms for operating the memory device of FIG. 13a during a sense operation. Waveforms 1291, 1292, 1293 and 1295 were discussed in connection with FIG. 12c. Waveform 1392 indicates that $V_{SGD}$ in the selected block is equal to $V_{SEL\_SGD\_DRV}$, such as 4.5 V. Waveform 1394 indicates that $V_{SGD}$ in the unselected block is equal to $V_{UNSEL\_SGD\_DRV}$, which can be set to $V_{OPTIMAL}$. $V_{SGS}$ in the unselected bock is also equal to this level since line 1127 is driven at this level.

FIG. 14a depicts a process for operating the memory device of FIG. 11a during a programming or sense operation. At step 1400, a program or sense operation begins. At step 1402, in a first time period, such as between t0-t1 in FIG. 11b, the drain select gate driver is set to output a voltage at a specified level, $V_{SGD\_DRV}$, such as $V_{SG}$, and the transfer transistor driver is set to output a voltage at a level $V_{TT\_DRV}=V_{TH(TT)}+V_{OPTIMAL}$. Typically, $V_{TH(TT)}$ is the same for different blocks. Note that the steps 1402 and 1404 can occur concurrently, but are shown separately for clarity. Similarly, steps 1406, 1408 and 1410 may occur concurrently but are also shown separately for clarity. At step 1404, in the first time period, the block decoders for the selected and unselected blocks are controlled to pass $V_{TT\_DRV}$ to the control gates of the associated transfer transistors so that $V_{SGD}=V_{OPTIMAL}$. At step 1406, in a second time period, such as between t1-t3 in FIG. 11b, the transfer gate driver is set to, e.g., $V_{PGM}+V_{TH(TT)}$ for a programming operation, or $V_{SENSE}+V_{TH(TT)}$, for a sensing operation. The corresponding selected word line driver is set to $V_{PGM}$ or $V_{SENSE}$, and the unselected word line drivers are set to a pass voltage level such as $V_{PASS}$ or $V_{READ-PASS}$.

Here, $V_{PGM}$ represents any programming level and $V_{SENSE}$ represents any sense level. The use of a two-step program pulse is not detailed here. At step 1408, in the second time period, the block decoder for the selected block is controlled to pass $V_{TT\,DRV}$ to the control gates of the associated transfer transistors, so that $V_{PGM}$ or $V_{SENSE}$ is provided on the selected word line. Also, $V_{SGD\,DRV}$ is set so that $V_{SGD}=V_{SG}$. At step 1410, the block decoder for the unselected block is controlled to not pass $V_{TT\,DRV}$ to the control gates of the associated transfer transistors so that $V_{SGD}$ floats at or near its previous level of $V_{OPTIMAL}$.

FIG. 14*b* depicts a process for operating the memory device of FIG. 12*a* during a programming or sense operation. At step 1416, a program or sense operation begins. At step 1418, in a time period such as between t1-t3 in FIG. 12*b*, the drain select gate driver is set to output a voltage at a specified level, $V_{SGD\,DRV}$, such as $V_{SG}$, the transfer transistor driver for the selected block is set to output a voltage at a level $V_{TT\,DRV\,SEL}=V_{PGM}+V_{TH(TT)}$ or $V_{SENSE}+V_{TH(TT)}$, the selected word line driver is set to $V_{PGM}$ or $V_{SENSE}$, the unselected word line drivers are set to a pass voltage level such as $V_{PASS}$ or $V_{READ-PASS}$, and the transfer transistor driver for the unselected block is set to output a voltage at a level $V_{TT\,DRV\,UNSEL}=V_{TH(TT)}+V_{OPTIMAL}$. Note that the steps 1418, 1420 and 1422 can occur concurrently, but are shown separately for clarity. At step 1420, the block decoder for the selected block is controlled to pass $V_{TT\,DRV\,SEL}$ to the control gates of the associated transfer transistors so that $V_{PGM}$ or $V_{SENSE}$ is provided on the selected word line. Also, $V_{SGD\,DRV}$ is set so that $V_{SGD\,SEL}=V_{SG}$. At step 1422, the block decoder for the unselected block is controlled to pass $V_{TT\,DRV\,UNSEL}$ to the control gates of the associated transfer transistors, so that $V_{SGD\,UNSEL}=V_{OPTIMAL}$.

Figure 14C:
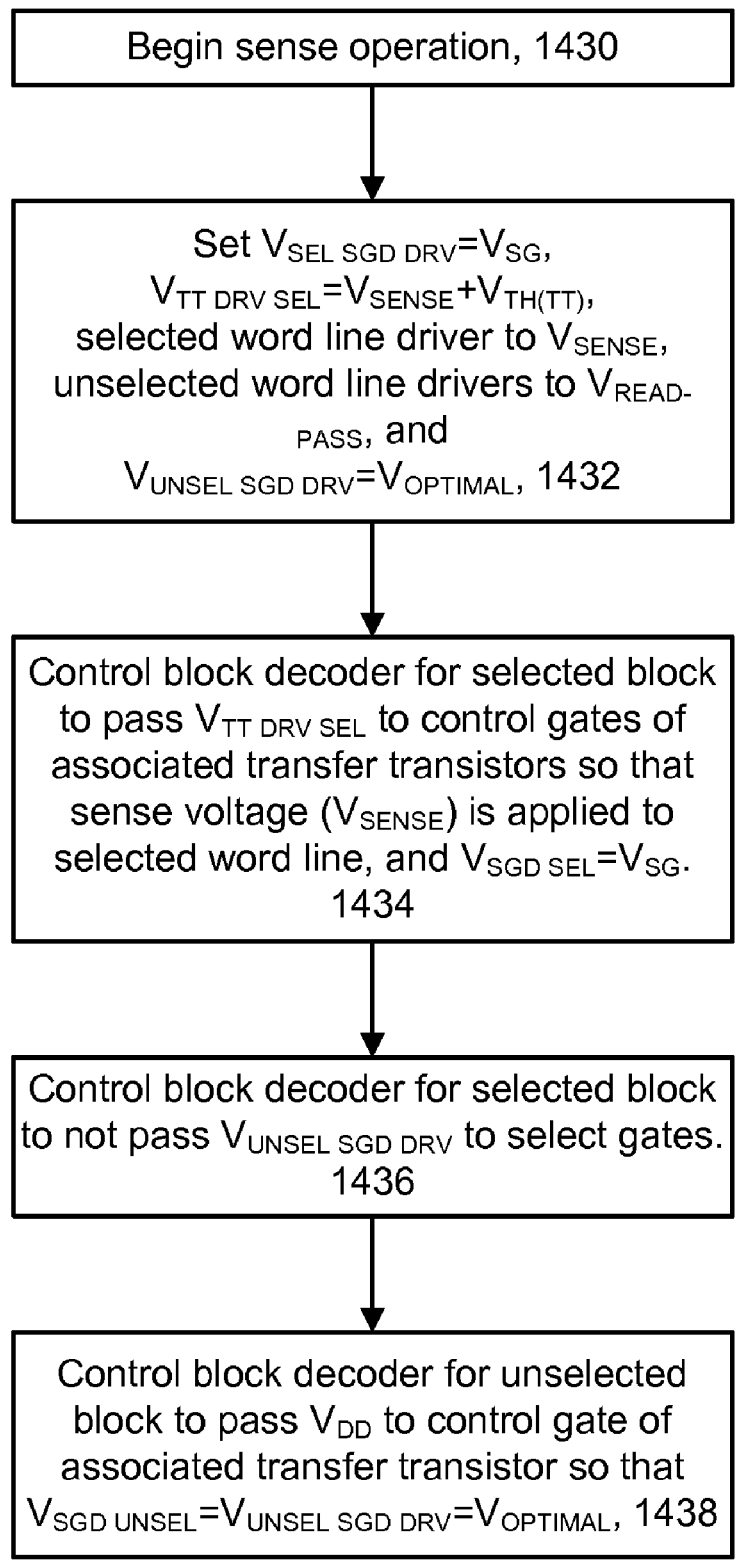
FIG. 14c depicts a process for operating the memory device of FIG. 13a during a sense operation.

FIG. 14*c* depicts a process for operating the memory device of FIG. 13*a* during a sense operation. At step 1430, a sense operation begins. At step 1432, in a time period such as between t1-t3 in FIG. 13*b*, the dedicated drain select gate driver for the selected block is set to output a voltage at a specified level, $V_{SEL\,SGD\,DRV}$, such as $V_{SG}$, the transfer transistor driver for the selected block is set to output a voltage at a level $V_{TT\,DRV\,SEL}=V_{SENSE}+V_{TH(TT)}$, the selected word line driver is set to $V_{SENSE}$, the unselected word line drivers are set to a read pass voltage level such as $V_{READ-PASS}$, and the dedicated select gate driver for the unselected block is set to output a voltage at a level of $V_{OPTIMAL}$. Note that the steps can occur concurrently, but are shown separately for clarity. At step 1434, the block decoder for the selected block is controlled to pass $V_{TT\,DRV\,SEL}$ to the control gates of the associated transfer transistors so that $V_{SENSE}$ is provided on the selected word line. Also, $V_{SEL\,SGD\,DRV}$ is set so that $V_{SGD\,SEL}=V_{SG}$. At step 1436, the block decoder for the selected block is controlled to pass 0 V to the control gate of the associated transfer transistor (e.g., transistor 1105 in FIG. 13*a*) so that that the transistor 1105 does not pass $V_{UNSEL\,SGD\,DRV}$ to the select gates of the selected block. At step 1438, the block decoder for the unselected block is controlled to pass $V_{DD}$ to the control gate of the associated transfer transistor (e.g., transistor 1125) so that the transistor 1125 does pass $V_{SGD\,UNSEL\,DRV}$ to the select gates on the unselected block.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   performing an operation involving a selected block of a memory device, the memory device includes at least one unselected block, the selected block and the at least one unselected block each comprise strings of series-connected non-volatile storage elements, where a drain select gate is at one end of each string, and bit lines which are common to the selected block and the at least one unselected block are in communication with active regions of the drain select gates of the selected block and the at least one unselected block, the performing includes:
   during a first time period, biasing the drain select gates of the selected block at a first non-zero level via a first transfer transistor which is associated with the selected block, and biasing the drain select gates of the at least one unselected block at the first non-zero level via a second transfer transistor which is associated with the at least one unselected block; and
   during a second time period which follows the first time period, concurrently: (a) biasing the drain select gates of the selected block via the first transfer transistor at a second non-zero level, which is higher than the first non-zero level, and (b) floating a voltage of the drain select gates of the at least one unselected block.

2. The method of claim 1, wherein:
   the operation comprises a programming operation, in which, concurrent with steps (a) and (b), a programming voltage is provided on a selected word line of the selected block while non-zero voltages are applied to at least a subset of the bit lines.

3. The method of claim 1, wherein:
   the operation comprises a sense operation, in which, concurrent with steps (a) and (b), a sense control gate voltage is provided on a selected word line of the selected block while non-zero voltages are applied to at least a subset of the bit lines.

4. The method of claim 1, wherein:
   the first non-zero level is 0.1 V to 0.3 V.

5. The method of claim 1, wherein:
   the first non-zero level is less than a threshold voltage of the drain select gates of the selected block and the at least one unselected block; and
   the second non-zero level is greater than the threshold voltage of the drain select gates of the selected block and the at least one unselected block.

6. The method of claim 1, wherein:
   a control gate of the first transfer transistor is coupled to a first block decoder;
   an input node of the first transfer transistor is coupled to a first voltage driver which has a first voltage output during the first time period and a higher, second voltage output in the second time period;
   a control gate of the second transfer transistor is coupled to a second block decoder;
   an input node of the second transfer transistor is coupled to the first voltage driver;
   during the first time period:
      the biasing the drain select gates of the selected block at the first non-zero level comprises controlling the first block decoder to couple the first voltage driver to the control gate of the first transfer transistor;

the biasing of the drain select gates of the at least one unselected block at the first non-zero level comprises controlling the second block decoder to couple the first voltage driver to the control gate of the second transfer transistor; and during the second time period:

the biasing of the drain select gates of the selected block at the second non-zero level comprises controlling the first block decoder to continue to couple the first voltage driver to the control gate of the first transfer transistor; and the floating of the voltage of the drain select gates of the at least one unselected block comprises controlling the second block decoder to discontinue coupling the first voltage driver to the control gate of the second transfer transistor.

7. The method of claim 1, wherein:
the first non-zero level is temperature-adjusted.

8. A method for operating non-volatile storage, comprising:

performing an operation involving a selected block of a memory device, the memory device includes at least one unselected block, the selected block and the at least one unselected block each comprise strings of series-connected non-volatile storage elements, where a drain select gate is at one end of each string, and bit lines which are common to the selected block and the at least one unselected block are in communication with active regions of the drain select gates of the selected block and the at least one unselected block, the performing includes concurrently:

applying a particular non-zero voltage to a selected word line of the selected; and biasing the drain select gates of the selected block at a first non-zero level via a first transfer transistor which is associated with the selected block, and biasing the drain select gates of the at least one unselected block at a different, second non-zero level via a second transfer transistor which is associated with the at least one unselected block.

9. The method of claim 8, wherein:
the operation comprises a programming operation, and the particular non-zero voltage comprises a programming voltage.

10. The method of claim 8, wherein:
the operation comprises a sense operation, and the particular non-zero voltage comprises a sense control gate voltage.

11. The method of claim 8, wherein:
the second non-zero level is less than the first non-zero level.

12. The method of claim 8, wherein:
the second non-zero level is 0.1 V to 0.3 V.

13. The method of claim 8, wherein:
a control gate of the first transfer transistor is coupled to a first block decoder;
the first block decoder is coupled to a first voltage driver;
a control gate of the second transfer transistor is coupled to a second block decoder;
the second block decoder is coupled to a second voltage driver;
input nodes of the first and second transfer transistors are coupled to a common select gate voltage driver which has a first voltage output;
the biasing of the drain select gates of the selected block at the first non-zero level comprises controlling the first block decoder to couple the first voltage driver to the control gate of the first transfer transistor;

the biasing of the drain select gates of the at least one unselected block at the second non-zero level comprises controlling the second block decoder to couple the second voltage driver to the control gate of the second transfer transistor.

14. The method of claim 8, wherein:
a control gate of the first transfer transistor is coupled to a first block decoder;
a control gate of the second transfer transistor is coupled to a second block decoder;
an input node of the first transfer transistor is coupled to a first select gate voltage driver which has a first voltage output;
an input node of the second transfer transistor is coupled to a second select gate voltage driver which has a second voltage output;
the biasing of the drain select gates of the selected block at the first non-zero level comprises controlling the first block decoder to provide a voltage on the control gate of the first transfer transistor which is sufficient to make the first transfer transistor conductive, thereby coupling the first voltage driver to the drain select gates of the selected block; and
the biasing of the drain select gates of the at least one unselected block at the second non-zero level comprises controlling the second block decoder to provide a voltage on the control gate of the second transfer transistor which is sufficient to make the second transfer transistor conductive, thereby coupling the second voltage driver to the drain select gates of the at least one unselected block.

15. A non-volatile storage system, comprising:
at least first and second blocks of non-volatile storage elements, each block comprises strings of series-connected non-volatile storage element, each string extends between a source select gate and a drain select gate;
a plurality of bit lines which are shared by the at least first and second blocks, the plurality of bit lines are coupled to active regions of the drain select gates of the at least first and second blocks;
a first transfer transistor coupled to: the drain select gates of the first block, a select gate driver, and a first block decoder;
first and second voltage drivers;
a second transfer transistor coupled to: the drain select gates of the second block, the select gate driver, and a second block decoder;
a common drain select gate driver which is coupled to the first and second transfer transistors; and
one or more control circuits, the one or more control circuits concurrently, when the first block is selected to perform an operation and the second block is unselected: (a) couple the first voltage driver to a control gate of the first transfer transistor, to control a voltage level of the drain select gates of the first block, and to (b) couple the second voltage driver, independent of the first voltage driver, to a control gate of the second transfer transistor, to control a voltage level of the drain select gates of the first block.

16. The non-volatile storage system of claim 15, wherein:
during the operation, a particular non-zero voltage is applied to a selected word line of the selected block while non-zero voltages are applied to at least a subset of the bit lines.

17. The non-volatile storage system of claim 15, wherein:
the voltage output of the second voltage driver is set based on the voltage level of the drain select gates of the second block plus a threshold voltage of the second transfer transistor.

18. The non-volatile storage system of claim 15, wherein:
the voltage level of the drain select gates of the second block is less than the voltage level of the drain select gates of the first block.

19. The non-volatile storage system of claim 15, wherein:
the voltage level of the drain select gates of the second block is 0.1 V to 0.3 V.

20. The non-volatile storage system of claim 15, wherein:
the strings are NAND strings.

* * * * *